United States Patent
Inoue

(10) Patent No.: US 9,715,993 B2
(45) Date of Patent: Jul. 25, 2017

(54) MULTI CHARGED PARTICLE BEAM WRITING APPARATUS, AND MULTI CHARGED PARTICLE BEAM WRITING METHOD

(71) Applicant: NuFlare Technology, Inc., Yokohama (JP)

(72) Inventor: Hideo Inoue, Miura-gun (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/944,671

(22) Filed: Nov. 18, 2015

(65) Prior Publication Data
US 2016/0155608 A1 Jun. 2, 2016

(30) Foreign Application Priority Data
Nov. 28, 2014 (JP) ................................. 2014-241349

(51) Int. Cl.
*H01J 37/317* (2006.01)
*H01J 37/304* (2006.01)
*H01J 37/04* (2006.01)

(52) U.S. Cl.
CPC .......... *H01J 37/304* (2013.01); *H01J 37/045* (2013.01); *H01J 37/3174* (2013.01); *H01J 2237/202* (2013.01)

(58) Field of Classification Search
CPC ......... H01J 37/045; H01J 37/304; H01J 37/31
See application file for complete search history.

(56) References Cited

U.S. PATENT DOCUMENTS 5,260,579 A  11/1993 Yasuda et al.
7,868,300 B2  1/2011 Kruit et al.
(Continued)

FOREIGN PATENT DOCUMENTS

JP  5-166707  7/1993
JP  2006-245096  9/2006
(Continued)

OTHER PUBLICATIONS

Office Action issued Jul. 26, 2016 in Taiwanese Patent Application No. 104133874 (with English translation).
(Continued)

*Primary Examiner* — Wyatt Stoffa
*Assistant Examiner* — Eliza Osenbaugh-Stewar
(74) *Attorney, Agent, or Firm* — Oblon, McClelland, Maier & Neustadt, L.L.P.

(57) ABSTRACT

A multi charged particle beam writing apparatus includes a deflector to collectively deflect each beam in an "on" state, by tracking control in such a way as to follow stage movement, an obtaining processing circuitry to obtain a deviation amount of an irradiation position of each beam of multi-beams depending on a tracking amount of the tracking control, a correction coefficient calculation processing circuitry to calculate a correction coefficient for correcting the deviation amount of the irradiation position depending on the tracking amount, for each beam of the multi-beams and for each irradiation position, a shot data generation processing circuitry to generate shot data where deviation of an irradiation position of each beam of multi-beams depending on a tracking amount is to be corrected using a correction coefficient, for each tracking operation, and a deflection control processing circuitry to control plural blankers, based on the shot data.

4 Claims, 16 Drawing Sheets

(56) References Cited

U.S. PATENT DOCUMENTS

| | | |
|---|---|---|
| 8,461,555 B2 | 6/2013 | Kurohori |
| 8,741,547 B2 | 6/2014 | Yoshikawa et al. |
| 8,816,276 B2 | 8/2014 | Touya et al. |
| 2006/0197453 A1 | 9/2006 | Nakayama et al. |
| 2007/0057204 A1 | 3/2007 | Kruit et al. |
| 2008/0078947 A1* | 4/2008 | Horiuchi ............... B82Y 10/00 250/492.2 |
| 2010/0209833 A1 | 8/2010 | Kurohori |
| 2013/0157198 A1 | 6/2013 | Yoshikawa et al. |
| 2013/0214172 A1 | 8/2013 | Touya et al. |
| 2013/0320230 A1 | 12/2013 | Yoshikawa et al. |

FOREIGN PATENT DOCUMENTS

| | | |
|---|---|---|
| JP | 2014-7379 | 1/2014 |
| KR | 10-2013-0135772 | 12/2013 |
| TW | 201102763 A | 1/2011 |
| TW | 201339743 A | 10/2013 |
| TW | 201344372 A | 11/2013 |
| TW | 201346461 A | 11/2013 |

OTHER PUBLICATIONS

Office Action issued Jul. 26, 2016 in Korean Patent Application No. 10-2015-0168737 (with English translation).

Office Action issued Jan. 4, 2017 in Korean Patent Application No. 10-2015-0168737 (with English language translation).

* cited by examiner

Reduced Shots (Shots Are Not Performed)

MULTI CHARGED PARTICLE BEAM WRITING APPARATUS, AND MULTI CHARGED PARTICLE BEAM WRITING METHOD

CROSS-REFERENCE TO RELATED APPLICATION

This application is based upon and claims the benefit of priority from the prior Japanese Patent Application No. 2014-241349 filed on Nov. 28, 2014 in Japan, the entire contents of which are incorporated herein by reference.

BACKGROUND OF THE INVENTION

Field of the Invention

Embodiments of the present invention relate generally to a multi charged particle beam writing apparatus and a multi charged particle beam writing method, and more specifically, relate to a method for correcting deflection positional deviation of each beam in multi-beam writing, for example.

Description of Related Art

In recent years, with high integration of LSI, the line width (critical dimension) of circuits of semiconductor devices is becoming progressively narrower. As a method for forming an exposure mask (also called a reticle) used to form circuit patterns on these semiconductor devices, the electron beam (EB) writing technique having excellent resolution is employed.

As an example employing the electron beam writing technique, a writing apparatus using multi-beams can be cited. Compared with the case of writing a pattern with a single electron beam, since in multi-beam writing it is possible to irradiate multiple beams at a time (one shot), the throughput can be greatly increased. For example, in a writing apparatus employing a multi-beam system, multi-beams are formed by letting portions of an electron beam emitted from an electron gun pass through a corresponding hole of a plurality of holes formed in the mask, blanking control is performed for each beam, and each unblocked beam is reduced by an optical system and collectively deflected by a deflector so as to irradiate a desired position on a target object or "sample".

In multi-beam writing, since a large region is irradiated at a time, the amount of positional deviation due to beam deflection varies depending upon the position in the region. Regarding this positional deviation, since multi-beams are collectively deflected in multi-beam writing, it is difficult to perform deflection correction for correcting the positional deviation amount, for each individual beam. Therefore, the positional deviation amount which varies for each individual beam is hard to be corrected. Particularly, when performing writing processing while moving, since the deflection position changes every second, it becomes more difficult to carry out deflection correction for each individual beam.

In connection with the multi-beam technique, there is disclosed a technique where a tracking operation in response to a stage movement is performed while being scanned by continuous multi-beams in one direction by raster scanning (refer to, e.g., Japanese Published Unexamined Patent Application (JP-A) No. 05-166707).

BRIEF SUMMARY OF THE INVENTION

According to one aspect of the present invention, a multi charged particle beam writing apparatus includes a stage configured to mount a target object thereon and to be continuously movable, an emitter configured to emit a charged particle beam, a multi-beam forming plate, in which a plurality of openings are formed, configured to form multi-beams by letting a region including a whole of the plurality of openings be irradiated with the charged particle beam and letting portions of the charged particle beam individually pass through a corresponding opening of the plurality of openings, a blanking array plate in which there are arranged a plurality of blankers configured to individually perform blanking deflection for a corresponding beam of the multi-beams having passed through the plurality of openings of the multi-beam forming member, a limiting aperture member configured to block each beam having been deflected to be in an "off" state by at least one of the plurality of blankers, a deflector configured to collectively deflect each beam in an "on" state having passed through the limiting aperture member, by tracking control in such a way as to follow a movement of the stage, an obtaining processing circuitry configured to obtain a deviation amount of an irradiation position of each beam of the multi-beams depending on a tracking amount of the tracking control, a correction coefficient calculation processing circuitry configured to calculate a correction coefficient for correcting the deviation amount of the irradiation position depending on the tracking amount, for each beam of the multi-beams and for each irradiation position, a shot data generation processing circuitry configured to generate shot data in which the deviation amount of the irradiation position of the each beam of the multi-beams depending on the tracking amount is to be corrected by using the correction coefficient, for each tracking operation, and a deflection control processing circuitry configured to control the plurality of blankers, based on the shot data.

According to another aspect of the present invention, a multi charged particle beam writing apparatus includes a stage configured to mount a target object thereon and to be continuously movable, an emitter configured to emit a charged particle beam, a multi-beam forming member, in which a plurality of openings are formed, configured to form multi-beams by letting a region including a whole of the plurality of openings be irradiated with the charged particle beam and letting portions of the charged particle beam individually pass through a corresponding opening of the plurality of openings, a blanking array device in which there are arranged a plurality of blankers configured to individually perform blanking deflection for a corresponding beam of the multi-beams having passed through the plurality of openings of the multi-beam forming member, a limiting aperture member configured to block each beam having been deflected to be in an "off" state by at least one of the plurality of blankers, a deflector configured to perform collective deflection of each beam in an "on" state having passed through the limiting aperture member, an obtaining processing circuitry configured to obtain a deviation amount of an irradiation position of each beam of the multi-beams depending on a deflection amount of the multi-beams, a correction coefficient calculation processing circuitry configured to calculate a correction coefficient for correcting the deviation amount of the irradiation position, for each beam and for each irradiation position, a shot data generation processing circuitry configured to generate shot data in which the irradiation position of the each beam of the multi-beams is corrected by using the correction coefficient, for each deflection shift cycle in a case where writing processing is performed while repeating a deflection shift cycle with treating continuous deflection shifts of the multi-beams performed a plurality of times as one deflection shift cycle, and a deflection control processing circuitry configured to control the plurality of blankers, based on the shot data.

According to yet another aspect of the present invention, a multi charged particle beam writing method includes obtaining a deviation amount of an irradiation position of each beam of multi-beams depending on a tracking amount of tracking control that collectively deflects the multi-beams in such a way as to follow a movement of a stage with a mounted target object, calculating a correction coefficient for correcting the deviation amount of the irradiation position depending on the tracking amount, for the each beam and for each irradiation position, generating shot data in which the deviation amount of the irradiation position of the each beam of the multi-beams depending on the tracking amount is to be corrected by using the correction coefficient, for each tracking operation, and writing a pattern on the target object while performing the tracking control, using the multi-beams whose each beam has been blanking controlled based on the shot data.

DETAILED DESCRIPTION OF THE INVENTION

In the embodiments below, there will be described a multi charged particle beam writing apparatus and a method thereof that can individually correct the amount of a positional deviation due to beam deflection of each beam of multi-beams.

In the embodiments below, there will be described a configuration in which an electron beam is used as an example of a charged particle beam. The charged particle beam is not limited to the electron beam, and other charged particle beam such as an ion beam may also be used.

Figure 1:
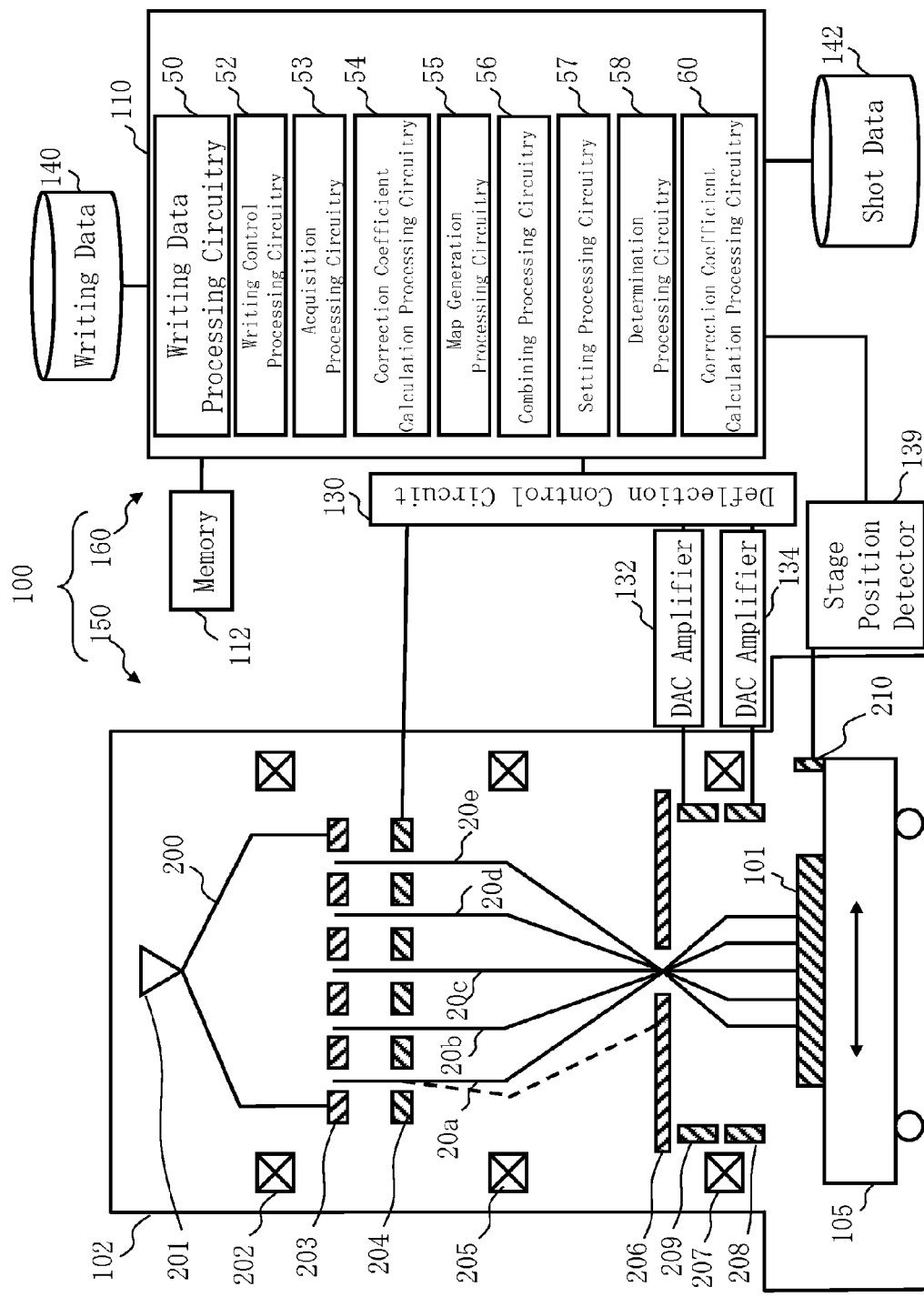
FIG. 1 is a schematic diagram showing a configuration of a writing apparatus according to a first embodiment.

FIG. 1 is a schematic diagram showing a configuration of a writing or "drawing" apparatus according to the first embodiment. In FIG. 1, a writing apparatus 100 includes a writing mechanism 150 and a control unit 160. The writing apparatus 100 is an example of a multi charged particle beam writing apparatus. The writing mechanism 150 includes an electron optical column 102 and a writing chamber 103. In the electron optical column 102, there are arranged an electron gun 201, an illumination lens 202, a multi-beam forming plate 203 (multi-beam forming array plate or "multi-beam forming array member"), a blanking plate 204 (blanking array plate or "blanking array device"), a reducing lens 205, a limiting aperture member 206, an objective lens 207, a main deflector 208 and a sub deflector 209. In the writing chamber 103, an XY stage 105 is arranged. On the XY stage 105, there is placed a target object or "sample" 101 such as a mask serving as a writing target substrate when writing is performed. For example, the target object 101 is an exposure mask used for manufacturing semiconductor devices, or is a semiconductor substrate (silicon wafer) on which semiconductor elements are formed. The target object 101 may be, for example, a mask blank on which resist has been applied and nothing has yet been written. Moreover, a mirror 210 for measuring the position of the XY stage 105 is arranged on the XY stage 105.

The control unit 160 includes a control computer 110, a memory 112, a deflection control circuit 130, DAC (digital-analog converter) amplifier units 132 and 134, a stage position detector 139, and storage devices 140 and 142 such as magnetic disk drives. The control computer 110, the memory 112, the deflection control circuit 130, the stage position detector 139, and the storage devices 140 and 142 are connected with each other through a bus (not shown). Writing data is input into the storage device 140 (storage unit) from the outside, and stored therein. The DAC amplifier units 132 and 134 are connected to the deflection control circuit 130. The DAC amplifier unit 132 is connected to the deflector 209, and the DAC amplifier unit 134 is connected to the main deflector 208.

In the control computer 110, there are arranged a writing data processing circuitry 50, a writing control processing circuitry 52, an obtaining processing circuitry 53, a correction coefficient calculation processing circuitry 54, a map generation processing circuitry 55, a combining processing circuitry 56, a setting processing circuitry 57, a determination processing circuitry 58, and a correction coefficient calculation processing circuitry 60. Each of the processing circuitries includes an electric circuit, a quantum circuit, a computer, a processor, a circuit board, or a semiconductor device, for example. Each of the processing circuitries may use the common processing circuitry (same processing circuitry), or may use different processing circuitries (separated processing circuitries). Data which is input and output to/from the writing data processing circuitry 50, the writing control processing circuitry 52, the obtaining processing circuitry 53, the correction coefficient calculation processing circuitry 54, the map generation processing circuitry 55, the combining processing circuitry 56, the setting processing circuitry 57, the determination processing circuitry 58, and the correction coefficient calculation processing circuitry 60, and data being operated are stored in the memory 112 each time.

FIG. 1 shows a configuration necessary for explaining the first embodiment. Other configuration elements generally necessary for the writing apparatus 100 may also be included. For example, although FIG. 1 shows the case where multi-beams are collectively deflected by the two-stage deflector composed of the main deflector 208 and the sub deflector 209, it is not limited thereto. For example, a single stage deflector or a multiple stage deflector of three or more stages may also be used.

Figure 2:
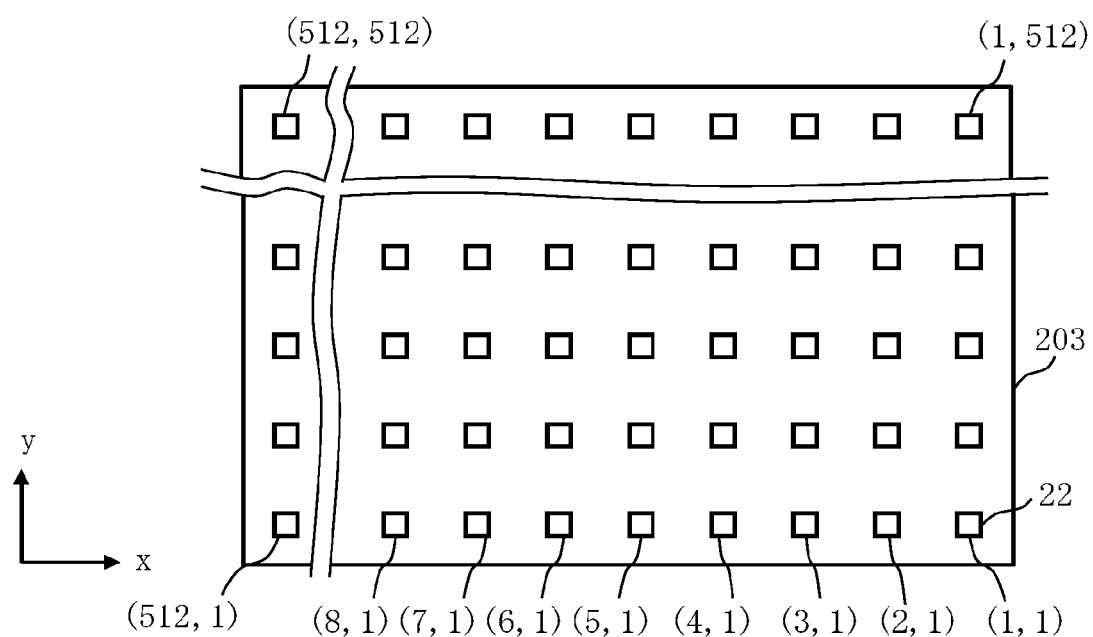
FIG. 2 is a conceptual diagram of a structure of a multi-beam forming plate according to the first embodiment.

FIG. 2 is a conceptual diagram showing an example of the structure of a multi-beam forming plate according to the first embodiment. In FIG. 2, holes (openings) 22 of m rows long (y direction) and n columns wide (x direction) (m≥2, n≥2) are formed, like a matrix, at a predetermined arrangement pitch in the multi-beam forming plate 203. In FIG. 2, for example, holes 22 of 512 (rows)×512 (columns) are formed in the length and width (x and y) directions. Each of the holes 22 is a quadrangle of the same dimensional shape. Alternatively, each of the holes 22 can be a circle of the same circumference. Multi-beams 20 are formed by letting portions of an electron beam 200 individually pass through a corresponding hole of a plurality of holes 22. The case in which the holes 22 of two or more rows and columns are arranged in the length and width (x and y) directions is shown here, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. Moreover, the method of arranging the holes 22 is not limited to the case of FIG. 2 where holes are arranged like a grid in the length and width directions. For example, with respect to the kth row and the (k+1)th row, which are arrayed in the length direction (y direction), each hole in the kth row and each hole in the (k+1)th row may be mutually displaced in the width direction (x direction) by a dimension "a". Similarly, each hole in the (k+1)th row and each hole in the (k+2)th row may be mutually displaced in the width direction (x direction) by a dimension "b", for example.

In the blanking plate 204 (blanking array device), passage holes (openings) through which multi-beams individually pass are formed at the positions each corresponding to each hole 22 of the multi-beam forming plate 203 of FIG. 2. Then, there are arranged a pair of electrodes (blanker: blanking deflector) for blanking deflection, which is close to a corresponding one of a plurality of passage holes and each of which is at the opposite side of the corresponding one of the plurality of openings. Moreover, close to each passage hole, a control circuit for applying a deflection voltage to one electrode of the blanker for each passage hole is arranged. The other one of the two electrodes for each beam is grounded (earthed).

The electron beam 20 passing through a corresponding passage hole is deflected by a voltage independently applied to the two electrodes being a pair. Blanking control is performed by this deflection. Blanking deflection is performed for each corresponding beam of the multi-beams. Thus, a plurality of blankers individually perform blanking deflection of a corresponding beam of the multi-beams having passed through a plurality of holes 22 (openings) of the multi-beam forming plate 203. In other words, a plurality of blankers, each of which performs blanking-deflection of a corresponding beam in the multi-beams individually having passed through a plurality of holes 22 of the multi-beam forming plate 203, are arranged in an array on the blanking plate 204 (blanking array device).

Figure 3:
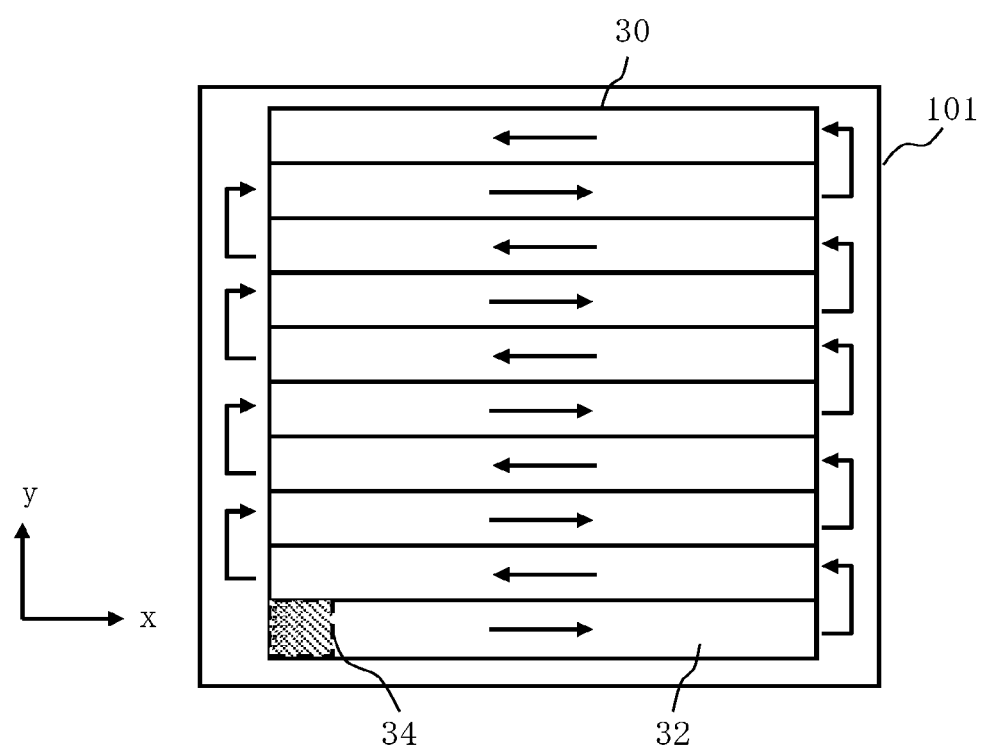
FIG. 3 is a conceptual diagram explaining an example of a writing operation according to the first embodiment.

FIG. 3 is a conceptual diagram explaining an example of a writing operation according to the first embodiment. As shown in FIG. 3, a writing region 30 of the target object 101 is virtually divided into a plurality of stripe regions 32 each in a strip shape and each having a predetermined width in the y direction, for example. Each of the stripe regions 32 serves as a unit region for writing. First, the XY stage 105 is moved to make an adjustment such that a sub field 34 (irradiation region) which can be irradiated with one irradiation of the multi-beams 20 is located at the left end of the first stripe region 32 or at a position more left than the left end, and then writing is started. When writing the first stripe region 32, by moving the XY stage 105 in the −x direction, for example, the writing advances relatively in the x direction. The XY stage 105 is continuously moved at a predetermined speed, for example. After writing the first stripe region 32, the stage position is moved in the −y direction to make an adjustment such that the sub field 34 is located at the right end of the second stripe region 32 or at a position more right than the right end to be relatively located in the y direction. Then, similarly, by moving the XY stage 105 in the x direction, for example, writing advances in the −x direction. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also preferable to perform writing in the same direction when writing each stripe region 32. By one shot, a plurality of shot patterns whose number is equal, at the maximum, to the number of the holes 22 are formed at a time by multi-beams which are formed by having passed through respective corresponding holes 22 of the multi-beam forming plate 203. FIG. 3 shows the case where the writing region of the target object 101 is divided into a plurality of stripe regions 32 arranged in the y direction, for example, by the width being substantially the same as the length size of the sub field 34, which can be irradiated by one irradiation of the multi-beams 20, for example. The width of the stripe region 32 is not limited to this. It is preferable for the width of the stripe region 32 to be n times (n being an integer of 1 or more) the size of the irradiation region 34.

Figure 4:
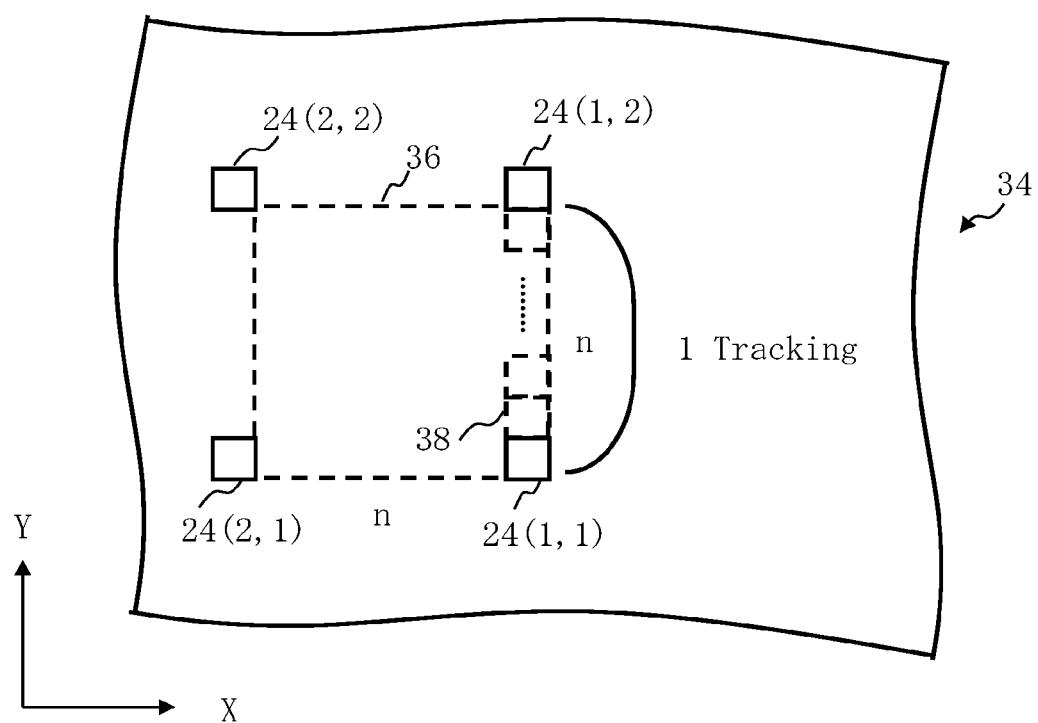
FIG. 4 shows an example of a write target pixel of multi-beams according to the first embodiment.

FIG. 4 shows an example of a write target pixel of multi-beams according to the first embodiment. In FIG. 4, the stripe region 32 is divided into a plurality of mesh regions each having the size of a beam of multi-beams, for example. Each mesh region serves as a write target pixel 38 (or described as a shot position, a shot region, or a write position). The size of the pixel 38 is not limited to the beam size. For example, it may be 1/n (n being an integer of 1 or more) of the beam size. FIG. 4 shows the case of multi-beams of 512 rows by 512 columns. In the sub field 34, there are shown a plurality of pixels 24 which can be irradiated by one irradiation of the multi-beams 20. In other words, the pitch between adjacent pixels 24 is the pitch between beams of the multi-beams. The example of FIG. 4 shows four pixels 24 serving as irradiation positions of four adjacent beams in the multi-beams of 512 rows by 512 columns which are irradiated simultaneously.

One grid 36 is configured in a square region surrounded by four adjacent pixels 24, and including one of the four pixels 24. In the case of FIG. 4, each grid 36 is configured by n×n pixels 38. In the first embodiment, writing processing is performed while a tracking control is carried out such that a deflection position deflected by the main deflector 208 follows continuous movement of the XY stage 105. In one tracking operation, each beam of the multi-beams 20 writes (exposes) n pixels, for example, in a corresponding responsible grid 36. Each beam performs writing of a different grid 36 during one tracking operation. In the example of FIG. 4, deflection shift is performed n times in the y direction for each beam by the sub deflector 209 during one tracking operation. Also in the next tracking operation, deflection shift is performed n times, and n pixels in the grid 36 are written by a beam different from that used last time. Treating such continuous deflection shifts of multi-beams performed a plurality of times (n times) as one deflection shift cycle, writing processing is performed while repeating the deflection shift cycle. Since one deflection shift cycle is performed during one tracking operation, the deflection shift cycle is turned out to be a tracking cycle.

In the example of FIG. 4, by performing the deflection shift cycle n times, all the pixels 38 in each grid 36 can be written. Although, in the example of FIG. 4, the deflection shift is performed in the y direction in order, it is not limited thereto. For example, it may be performed in the x direction n times in order. Alternatively, the deflection shift may be performed diagonally at 45 degrees n times in order, for example. Moreover, although in the example of FIG. 4 n pixels in one row are exposed by one deflection shift cycle (tracking cycle), it is not limited thereto. It is also preferable to expose pixels more than the n pixels in one row, or less than that.

Figure 5:
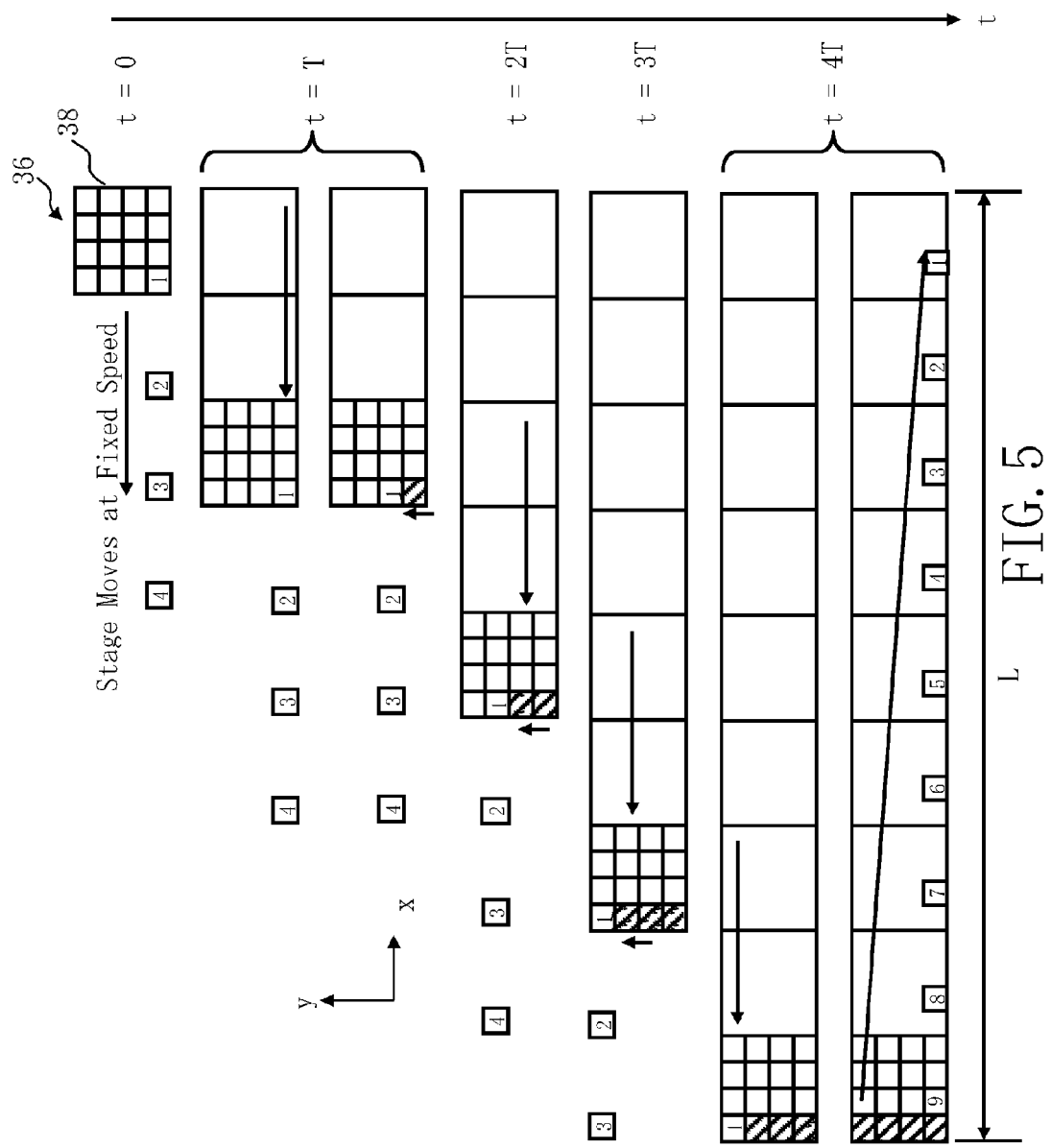
FIG. 5 illustrates an example of a writing method of multi-beams according to the first embodiment.

FIG. 5 illustrates an example of a writing method of multi-beams according to the first embodiment. FIG. 5 shows a portion of the grid 36 to be written by respective beams of the coordinates (1, 3), (2, 3), (3, 3), . . . , (512, 3) in the third row in the y direction from the bottom in the multi-beams. In the case of FIG. 5, while the XY stage 105 moves the distance of eight beam pitches, four pixels 38 are written (exposed), for example.

The writing data processing circuitry 50 reads writing data from the storage device 140, and performs a plurality of stages of data conversion processing to generate shot data. Shot data is generated for each pixel 36, and then, the writing time (irradiation time) is calculated. Specifically, a pattern defined in the writing data is assigned to a pixel. Then, the area density of the pattern is calculated for each pixel. It is preferable that the irradiation time of each beam to be actually applied is obtained by multiplying a reference dose by a calculated area density of the pattern. For example, when no pattern is formed in a target pixel 38, since beam irradiation is not performed, an identification code indicating writing time zero or no beam irradiation is defined. A maximum writing time T (maximum exposure time) in one multi-beam shot is set in advance. It is preferable that the irradiation time of each beam is a time period equivalent to a dose (irradiation amount) that has been corrected with respect to a dimension variation amount generated due to a phenomenon (not shown) such as a proximity effect, a fogging effect result, and a loading effect. Therefore, the irradiation time of each beam to be actually applied may be different from each other. The writing time (irradiation time) of each beam is obtained as a value within the maximum writing time T.

According to the first embodiment, as described above, in order to individually correct, for each beam, a positional deviation amount generated due to beam deflection, shot data itself is corrected as to be described later. Here, regardless of correction or non-correction of a positional deviation amount generated due to such beam deflection, first, a writing method performed while carrying out a tracking operation will be described.

Tracking control by beam deflection is started such that writing positions of respective beams of the multi-beams 20 collectively follow the movement of the XY stage 105. Specifically, the stage position detector 139 measures the position of the XY stage 105 by irradiating a laser onto the mirror 210 and receiving a catoptric light from the mirror 210. The measured position of the XY stage 105 is output to the control computer 110. In the control computer 110, the writing control processing circuitry 52 outputs the position information on the XY stage 105 to the deflection control circuit 130. In the deflection control circuit 130, deflection amount data (tracking deflection data) is calculated so that beam deflection may be performed to follow the movement of the XY stage 105. The tracking deflection data being a digital signal is output to the DAC amplifier 134. In the DAC amplifier 134, the digital signal is converted to an analog signal and amplified to be applied as a tracking deflection voltage to the main deflector 208.

While performing tracking control by beam deflection such that the writing positions of respective beams of the multi-beams 20 collectively follow the movement of the XY stage 105, the writing mechanism 150 emits a beam in the "on" state in the multi-beams 20 to a corresponding writing position of each beam during a corresponding writing time period within a pre-set maximum writing time T. Specifically, it operates as described below.

The electron beam 200 emitted from the electron gun 201 (emitter) almost perpendicularly (e.g., vertically) illuminates the whole of the multi-beam forming plate 203 by the illumination lens 202. A plurality of holes (openings) each being a quadrangle are formed in the multi-beam forming plate 203. The region including all the plurality of holes 22 is irradiated by the electron beam 200. For example, a plurality of quadrangular electron beams (multi-beams) 20a to 20e are formed by letting portions of the electron beam 200, which irradiates the positions of a plurality of holes 22, individually pass through a corresponding hole of the plurality of holes 22 of the multi-beam forming plate 203. The multi-beams 20a to 20e individually pass through corresponding blankers (first deflector: individual blanking mechanism) of the blanking plate 204. Each blanker deflects (performs blanking deflection) an individually passing electron beam 20 to be beam "on" during a calculated writing time (irradiation time) and to be beam "off" during the other time period.

The multi-beams 20a, 20b, . . . , 20e having passed through the blanking plate 204 are reduced by the reducing lens 205, and travel toward the hole in the center of the limiting aperture member 206. At this time, the electron beam 20 having been deflected to be beam "off" by the blanker of the blanking plate 204 deviates from the hole in the center of the limiting aperture member 206 (blanking aperture member) and is blocked by the limiting aperture member 206. On the other hand, the electron beam 20 which was not deflected by the blanker of the blanking plate 204 or was deflected to be beam "on" passes through the hole in the center of the limiting aperture member 206 as shown in FIG. 1. Blanking control is performed by on/off of the individual blanking mechanism in order to control on/off of the beam. Thus, the limiting aperture member 206 blocks each beam which was deflected to be in the "off" state by the individual blanking mechanism. One beam shot is formed by a beam which has been formed during from a beam "on" state to a beam "off" state and has passed through the limiting aperture member 206. The multi-beams 20 having passed through the limiting aperture member 206 are focused by the objective lens 207 and become a pattern image of a desired reduction rate by the objective lens 207, and while tracking deflection is performed by the main deflector 208, respective beams (the entire multi-beams 20) having passed through the limiting aperture member 206 are collectively deflected in the same direction by the sub deflector 209 so as to irradiate writing positions (irradiation positions) of respective beams on the target object 101. In other words, while the XY stage 105 is continuously moving, for example, tracking control is performed by the main deflector 208 so that writing positions (irradiation positions) of beams may follow the movement of the XY stage 105. Ideally, the multi-beams 20 to irradiate at a time are aligned at pitches obtained by multiplying the arrangement pitch of a plurality of holes of the multi-beam forming plate 203 by the desired reduction rate described above. The writing apparatus 100 executes a writing operation by a deflection shift method that sequentially performs irradiation of a shot beam while shifting the writing position, and when writing a desired pattern, a beam needed according to a pattern is controlled to be beam "on" by blanking control.

In the case of FIG. 5, by the first shot of a beam (1) of coordinates (1, 3), the first pixel from the left in the first row from the bottom of the grid 36 concerned (or "target grid" or "grid of interest") is irradiated during from the time t=0 to the maximum writing time T, for example. The XY stage 105 moves two beam pitches at a fixed speed in the −x direction during the time from t=0 to t=T, for example. During this time period, the tracking operation is continued.

In the deflection shift step, after the maximum writing time T has passed, while the beam deflection for tracking control is continued by the main deflector 208, the writing position of each beam is shifted to a next writing position (pixel) of each corresponding beam by collectively deflecting the multi-beams 20 by the sub deflector 209, in addition to the beam deflection for tracking control. In the case of FIG. 5, when the time becomes t=T, the pixel to be written (write target pixel) is shifted from the first pixel 38 from the left in the first row from the bottom of the grid 36 concerned to the first pixel 38 from the left in the second row from the bottom. Since the XY stage 105 is moving at a fixed speed also during this time period, the tracking operation is continued.

While the tracking control is continued, during a corresponding writing time within the maximum writing time T, a corresponding beam in the "on" state in the multi-beams 20 is applied to a shifted writing position of each beam. In the example of FIG. 5, by the second shot of the beam (1), the first pixel from the left in the second row from the bottom of the grid 36 concerned is irradiated during the time from t=T to t=2T, for example. The XY stage 105 moves two beam pitches at a fixed speed in the −x direction during the time from t=T to t=2T. During this time period, the tracking operation is continued.

As described above, beam shot (writing), shift, beam shot (writing), shift, beam shot (writing), and so on are repeated. In the case of FIG. 5, when the time becomes t=2T, the pixel to be written is shifted from the first pixel from the left in the second row from the bottom of the grid 36 concerned to the first pixel from the left in the third row from the bottom. Since the XY stage 105 is moving at a fixed speed also during this time period, the tracking operation is continued. Then, by the third shot of the beam (1), the first pixel from the left in the third row from the bottom of the grid 36 concerned is irradiated during the time from t=2T to t=3T, for example. The XY stage 105 moves, for example, two beam pitches at a fixed speed in the −x direction during the time from t=2T to t=3T. During this time period, the tracking operation is continued. When the time becomes t=3T, the pixel to be written is shifted from the first pixel from the left in the third row from the bottom of the grid 36 concerned to the first pixel from the left in the fourth row from the bottom. Since the XY stage 105 is moving at a fixed speed also during this time period, the tracking operation is continued. Then, by the fourth shot of the beam (1), the first pixel from the left in the fourth row from the bottom of the grid 36 concerned is irradiated during the time from t=3T to t=4T, for example. The XY stage 105 moves, for example, two beam pitches at a fixed speed in the −x direction during the time from t=3T to t=4T. During this time period, the tracking operation is continued. By what is described above, writing of the pixels in the first column from the left of the grid 36 concerned has been completed.

In the tracking reset step, after emitting a corresponding beam to the writing position of each beam which has been shifted at least once, in this case having been shifted three times, while continuing tracking control, the DAC amplifier 134 returns the tracking position to the tracking start position, where the tracking control was started, by resetting the beam deflection for tracking control. In the case of FIG. 5, when the time becomes t=4T, tracking of the grid 36 concerned is removed, and beam is swung back to a new target grid shifted by eight beam pitches in the x direction. Although the beam (1) has been described in the example of FIG. 5, writing is similarly performed for each corresponding grid of a beam of other coordinates. That is, when the time is t=4T, the beam of coordinates (n, m) completes writing of the pixels in the first column from the left in a corresponding grid set when the time was t=0. For example, a beam (2) of coordinates (2,3) completes writing of pixels in the first column from the left in a grid which is adjacent in the −x direction to the grid 36 concerned for the beam (1) of FIG. 5. In swinging back a beam, in order to start the next tracking from the position of another target grid 36 shifted by eight beam pitches in the x direction after a settling time Ts has passed, it is preferable, when the time is t=4T, to return the tracking position to a position shifted a little in the +x direction from the grid position (the position shifted by eight beam pitches) at the time t=0, that is, to return the tracking position more than the distance obtained by multiplying the stage speed V by Ts.

Since writing of the pixels in the first column from the left of each grid 36 has been completed, when tracking is reset, the sub deflector 209 performs deflection such that the writing position of each corresponding beam is adjusted (shifted) to coincide with the second pixel from the left in the first row from the bottom of each grid.

When performing the writing operation as described above, there may be generated a positional deviation from the design position of each beam caused by a beam shift amount (first beam deflection amount) of deflection shift by the sub deflector 209, and a positional deviation from the design position of each beam caused by a tracking amount (second beam deflection amount) of tracking deflection by the main deflector 208. These positional deviation amounts may be different from each other for each beam. Since the multi-beams 20 are collectively deflected as described above, it is difficult to individually correct a deflection amount of each beam by adjusting the deflection amount by the deflector, such as the main deflector 208 or the sub deflector 209.

Then, according to the first embodiment, the positional deviation of each beam is individually corrected by correcting the shot data itself. The following two cases can be described as the correction method.

Case (1): a positional deviation from the design position of each beam caused by a beam shift amount (first beam deflection amount) of deflection shift by the sub deflector 209 is corrected.

Case (2): a positional deviation from the design position of each beam caused by a beam shift amount (first beam deflection amount) of deflection shift by the sub deflector 209, and a positional deviation from the design position of each beam caused by a tracking amount (second beam deflection amount) of tracking deflection by the main deflector 208 are both corrected.

It goes without saying that the most preferable method is to perform the case (2), but even when performing the case (1), it becomes effective since a positional deviation amount can be reduced compared with a conventional case. First, the case (1) will be described below.

Figure 6:
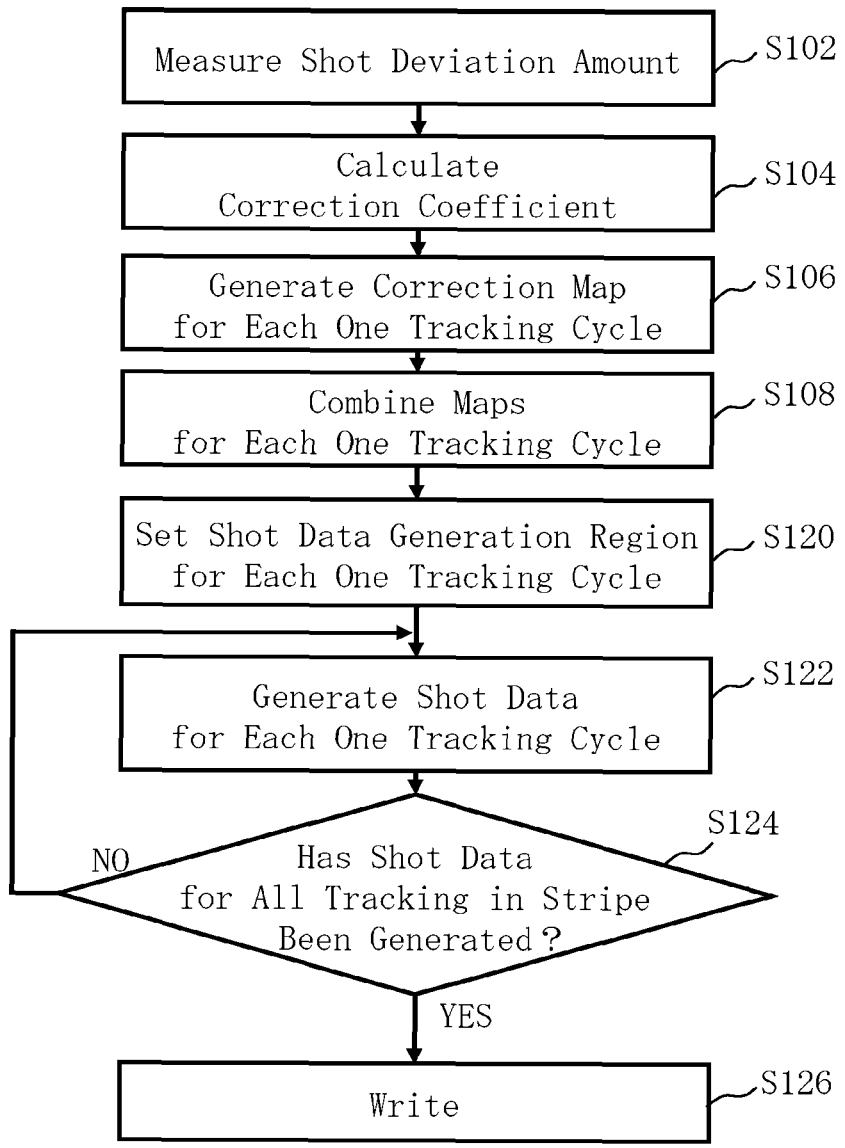
FIG. 6 is a flowchart showing main steps of a writing method according to the first embodiment.

FIG. 6 is a flowchart showing main steps of a writing method according to the first embodiment. As shown in FIG. 6, a series of steps: a shot deviation amount measurement step (S102), a correction coefficient calculation step (S104), a correction map generation step (S106) for each tracking cycle, a correction map combination step (S108) for each tracking cycle, a shot data generation region setting step (S120) for each tracking cycle, a shot data generation step (S122) for each tracking cycle, a determination step (S124), and a writing step (S126) are performed in the writing method according to the first embodiment.

In the shot deviation amount measurement step (S102), the deviation amount of the irradiation position of each beam of the multi-beams 20 is measured which depends on abeam shift amount (deflection amount of multi-beams) of deflection shift by the sub deflector 209. Specifically, a positional deviation amount of each beam is measured for each deflection shift amount by irradiating a resist-coated evaluation substrate with the multi-beams 20 each time while varying the deflection shift amount by the sub deflector 209. The deflection shift amount should be a deflection amount corresponding to each shift position of deflection shift of multi-beams performed a plurality of times serially in one tracking operation (deflection shift cycle). The shot order, shift direction, and shift amount are determined depending on a writing sequence. Therefore, if the writing sequence is set in advance, the shot order, shift direction, and shift amount of a tracking operation (deflection shift cycle) can be determined. Regarding the measurement, a resist pattern is formed by developing the evaluation substrate written (exposed) by the multi-beams 20, and each patterned beam position should be measured. If it is difficult to individually determine the measurement of the pattern position after the exposure in the case of shifting per pixel 38, writing may be preferably performed for each shift position or for every several shift positions while changing the irradiation region of the evaluation substrate by moving the XY stage 105. Then, by calculating a difference from the design position, it is possible to obtain a deviation amount of the irradiation position of each beam of the multi-beams 20 which depends on a beam shift amount (deflection amount of multi-beams 20) of deflection shift by the sub deflector 209. The obtained deviation amount data of the irradiation position of each beam is input into the writing apparatus 100, and obtained by the obtaining processing circuitry 53.

In the correction coefficient calculation step (S104), the correction coefficient calculation processing circuitry 54 calculates, for each beam and for each irradiation position, a correction coefficient of deflection deviation depending on deflection shift, (that is, correction coefficient (1)), for correcting a deviation amount of a beam irradiation position.

Figure 7:
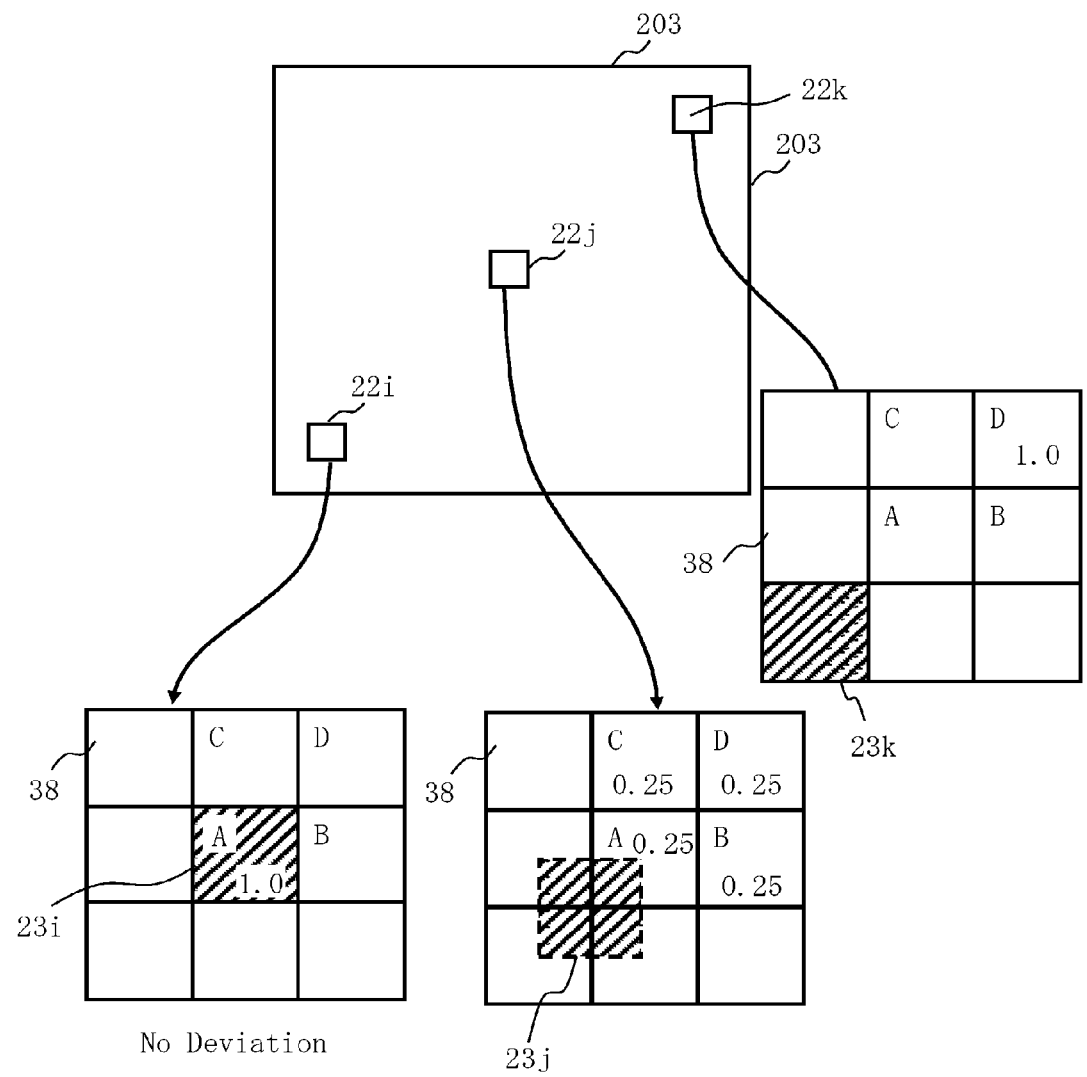
FIG. 7 is a conceptual diagram explaining a method for correcting a positional deviation of multi-beams according to the first embodiment.

FIG. 7 is a conceptual diagram explaining a method for correcting a positional deviation of multi-beams according to the first embodiment. In the example of FIG. 7, each beam is specified by using a plurality of holes 22 formed in the multi-beam forming plate 203. It will be described citing a hole 22$i$ in the first column from the left and the first row from the bottom, a hole 22$j$ in the center, and a hole 22$k$ in the first column from the right and the first row from the top, in a plurality of holes 22 formed in the multi-beam forming plate 203. When emitting a a beam 23$i$ formed by having passed through the hole 22$i$ to a target pixel 38(A) on the surface of the target object 101, as shown in FIG. 7, if the irradiation position of the beam 23$i$ on the surface of the target object 101 does not deviate from the position of the pixel 38(A), since there is no positional deviation, the correction coefficient of deflection deviation depending on deflection shift, for the pixel 38(A) at the time of irradiating the pixel 38(A) with the beam 23$i$ should be "1.0".

When emitting a beam 23$j$ formed by having passed through the hole 22$j$ to a desired target pixel 38(A') on the surface of the target object 101, as shown in FIG. 7, if the irradiation position of the beam 23$j$ on the surface of the target object 101 deviates from the position of the pixel 38(A') by 0.5 pixel in the −x direction and 0.5 pixel in the −y direction, the positional deviation can be corrected by dividing (distributing) ¼ of the dose, which is to be applied to the pixel 38(A'), to an adjacent pixel 38(B') shifted from the pixel 38(A') by 1 pixel in the x direction, ¼ of it to an adjacent pixel 38(C') which is shifted from the pixel 38(A') by 1 pixel in the y direction, and ¼ of it to an adjacent pixel 38(D') which is shifted from the pixel 38(A') by 1 pixel in the x direction and 1 pixel in the y direction. Therefore, for correcting a positional deviation generated by irradiating the pixel 38(A') with the beam 23$j$, it is necessary to expose the four pixels 38(A' to D') with a corrected beam 23$j$ whose dose has been corrected. In that case, the correction coefficient of deflection deviation depending on deflection shift is "0.25" for the pixel 38(A'), that for the pixel 38(B') is "0.25", that for the pixel 38(C') is "0.25", and that for the pixel 38(D') is "0.25". In other words, it is necessary to additionally expose the three pixels 38(B' to D').

When emitting a beam 23$k$ formed by having passed through the hole 22$k$ to a desired target pixel 38(A") on the surface of the target object 101, as shown in FIG. 7, if the irradiation position of the beam 23$k$ on the surface of the target object 101 deviates from the position of the pixel 38(A") by 1 pixel in the −x direction and 1 pixel in the −y direction, the positional deviation can be corrected by dividing (distributing) 100% of the dose, which is to be applied to the pixel 38(A"), to an adjacent pixel 38(D") shifted from the pixel 38(A") by 1 pixel in the x and 1 pixel in the y direction. Therefore, for correcting a positional deviation generated by irradiating the pixel 38(A") with the beam 23$k$, it is necessary to expose the pixel 38(D") instead of the pixel 38(A") with the beam 23$k$. In that case, the correction coefficient for the pixel 38(D") is "1.0". It is needless to say that the correction coefficient of deflection deviation depending on deflection shift is "0" for the pixel 38(A"). In other words, it is necessary to expose a different pixel from a target pixel.

As described above, when a beam position deviation occurs, such a deviation can be corrected by dividing (distributing) a dose to surrounding pixels, in proportion as an area ratio of a portion deviated from the target pixel in the direction opposite to the position deviation direction. Also, when irradiating the surrounding pixel with a beam having positional deviation, position deviation occurs with respect to the surrounding pixel. As a result, a portion of the beam to be applied to the surrounding pixel overlaps with the target pixel. Therefore, such a dose accumulates in the target pixel. On the other hand, the surrounding pixels are irradiated by only a portion of the beam to be applied to the surrounding pixels. Such a dose is insufficient for resist resolution. Therefore, forming a pattern in the surrounding pixels can be avoided. Thereby, it is possible to correct the position deviation of the target pixel.

Therefore, the correction coefficient calculation processing circuitry 54 specifies, for each beam and for each irradiation position (target pixel to be irradiated), surrounding pixels which are needed for correcting a deviation amount of a beam irradiation position, and calculates a ratio of the dose to be divided (distributed) to the specified surrounding pixels, and a ratio of the dose to be left for the target pixel, as correction coefficients of deflection deviation depending on deflection shift, that is correction coefficients (1).

In the correction map generation step (S106) for each tracking cycle, the map generation processing circuitry 55 specifies, for each tracking cycle (deflection shift cycle) and for each beam, a pixel which needs to be exposed, and generates a correction map in which the correction coefficient of deflection deviation depending on deflection shift (that is, correction coefficient (1)) for the specified pixel is defined.

Figure 8:
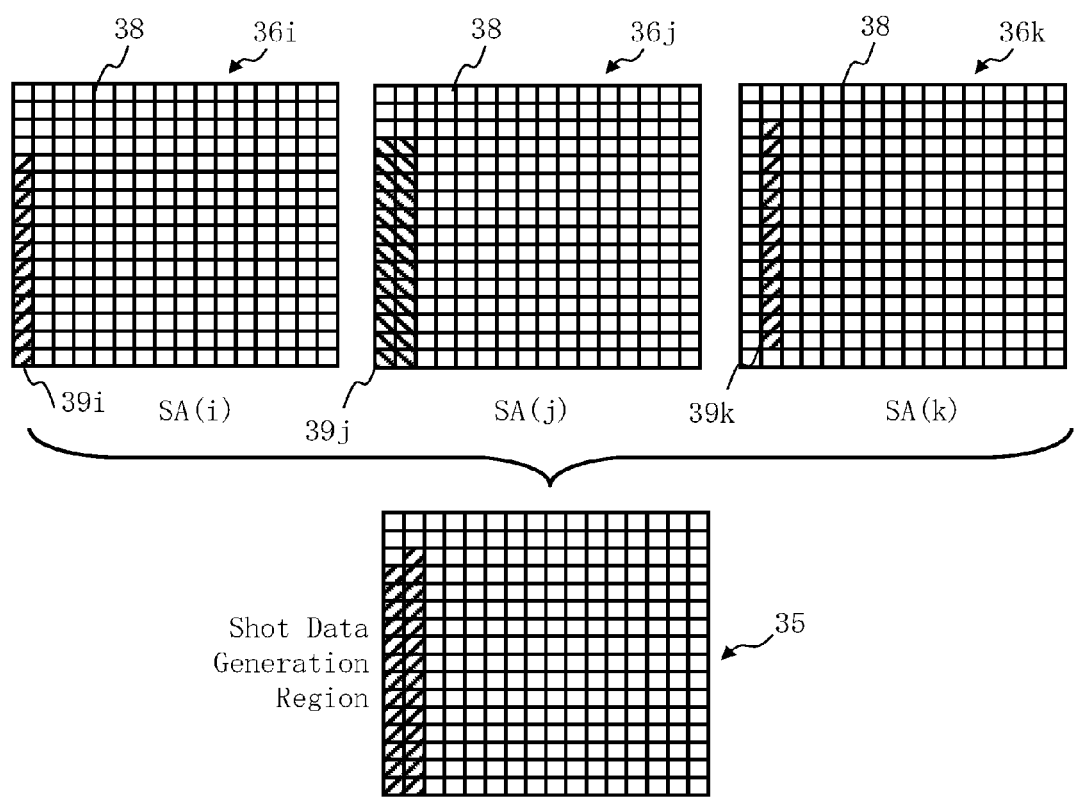
FIG. 8 shows an example of a correction map according to the first embodiment.

FIG. 8 shows an example of a correction map according to the first embodiment. FIG. 8 shows the case where the grid 36 is composed of 16×16 pixels. In FIG. 8, the correction map is mapped using the pixel 38 as a unit in the grid 36, and, for each tracking cycle (deflection shift cycle) and for each beam, a pixel 39 which needs to be exposed is shown in a plurality of pixels 38 in the grid 36 to be exposed by the beam concerned. A calculated correction coefficient of deflection deviation depending on deflection shift is defined as a map value for the pixel 39 which needs to be exposed. If a plurality of correction coefficients of deflection deviation depending on deflection shift are calculated for one pixel 38, a total value obtained by adding all the correction coefficients should be defined, as a map value of one pixel concerned, in the correction map.

In the correction map combination step (S108) for each tracking cycle, the combining processing circuitry 56 combines, for each tracking cycle (deflection shift cycle), correction maps which have been generated for each tracking cycle (deflection shift cycle) and for each beam, and generates a combined map 35 as shown in FIG. 8. In the combined map 35, any pixel to be exposed by any one of beams is defined as the pixel 39 that needs to be exposed. Since the entire multi-beams 20 are collectively deflected, not being individually deflected, even if positions of the grids 36 to be irradiated by respective beams may be different from each other, in the case of performing a deflection shift, shifting is carried out in the same direction and by the same movement amount in each of all the grids 36. Therefore, it is necessary to adjust a writing step to a pixel having the maximum value of the writing time (irradiation time). The combined map 35 enables to specify, for each tracking cycle, the pixel 39 which needs to be exposed in a target tracking cycle concerned. That is, the number of the pixel 39 which needs to be exposed increases in proportion as the positional deviation amount due to a beam deflection increases. As a result, the number of times of shifting during a tracking cycle increases. Furthermore, it leads to increase of the exposure time (writing time).

In the shot data generation region setting step (S120) for each tracking cycle, the setting processing circuitry 57 specifies, referring to the combined map 35, the pixel 39 which needs to be exposed. Then, since shot data is needed for the pixel 39 to be exposed, the setting processing circuitry 57 sets a shot data generation region for each tracking cycle, based on the position of the pixel 39 which needs to be exposed.

In the shot data generation step (S122) for each tracking cycle, the writing data processing processing circuitry 50 generates shot data for a pixel in a shot data generation region. As described above, shot data is generated for each pixel 38, and the writing time (irradiation time) is calculated. The writing data processing circuitry 50 (shot data generation processing circuitry) generates, for each tracking cycle (deflection shift cycle), shot data in which the irradiation position of each beam of multi-beams is to be corrected, by using the correction coefficient of deflection deviation depending on deflection shift (which is also referred to just as a correction coefficient) defined in the correction map for each beam. The dose of each pixel can be defined by a value obtained by multiplying a base dose, an area density of a pattern to be assigned to a pixel concerned, and a correction coefficient of deflection deviation depending on deflection shift of the pixel concerned. Therefore, the irradiation time can be obtained by dividing the dose of a pixel concerned by a current density J. The shot data is stored in the storage device 142.

In the determination step (S124), the determination processing circuitry 58 determines whether shot data for all the tracking cycles for writing the target stripe region 32 to be written has been generated. When the shot data for all the tracking cycles has not been generated yet, the shot data generation step (S122) and the determination step (S124) for each tracking cycle are repeated until the shot data for all the tracking cycles has been generated.

In the writing step (S126), the writing mechanism 150 writes, using the shot data, a pattern on the target object 101 with the multi-beams 20. Specifically, the deflection control circuit 130 (deflection control unit) outputs, based on the shot data, a blanking control signal to a control circuit for individual blanking formed on the blanking plate 204. After the blanking control signal is converted into an analog signal in the control circuit, a deflection voltage is applied to a blanker electrode corresponding to each of a plurality of blankers. Thereby, the deflection control circuit 130 controls a plurality of blankers, based on the shot data. Writing processing proceeds while performing a plurality of deflection shifts which are serially carried out in tracking according to the tracking operation described above.

As described above, by correcting the shot data itself, it is possible to reduce or eliminate positional deviation from the design position of each beam, resulting from the beam shift amount (first beam deflection amount) of deflection shift by the sub deflector 209.

Next, case (2) will be described. That is, a positional deviation from the design position of each beam caused by a beam shift amount (first beam deflection amount) of deflection shift by the sub deflector 209, and a positional deviation from the design position of each beam caused by a tracking amount (second beam deflection amount) of tracking deflection by the main deflector 208 are both corrected. The writing method is the same as that described in the flowchart of FIG. 6.

In the shot deviation amount measurement step (S102), the contents having been described in the case (1) and the contents described below are both carried out. The amount of positional deviation from the design position of each beam caused by a tracking amount (second beam deflection amount) of tracking deflection by the main deflector 208 is measured. Specifically, without performing deflection shift by the sub deflector 209, a positional deviation amount of each beam is measured for each tracking amount by irradiating a resist-coated evaluation substrate with the multi-beams 20 each time at the position of each amount of a plurality of tracking amounts, while performing tracking deflection by the main deflector 208. Regarding the measurement, a resist pattern is formed by developing the evaluation substrate written (exposed) by the multi-beams 20, and each patterned beam position should be measured. Then, by calculating a difference from the design position, it is possible to obtain a deviation amount of the irradiation position of each beam of the multi-beams 20, which depends on a tracking amount of tracking control. The obtained deviation amount data of the irradiation position of each beam is input into the writing apparatus 100, and obtained by the obtaining processing circuitry 53. Thereby, the positional deviation from the design position of each beam caused by a beam shift amount (first beam deflection amount) of deflection shift by the sub deflector 209, and the positional deviation from the design position of each beam caused by a tracking amount (second beam deflection amount) of tracking deflection by the main deflector 208 can be measured. Alternatively, it is also preferable to collectively perform measuring as described below.

A positional deviation amount is measured which is obtained by combining a deviation amount of the irradiation position of each beam of the multi-beams 20 depending on a beam shift amount (deflection amount of multi-beams) of deflection shift by the sub deflector 209, and a positional deviation from the design position of each beam caused by a tracking amount (second beam deflection amount) of tracking deflection by the main deflector 208. Specifically, a positional deviation amount of each beam is measured for each deflection shift amount by irradiating a resist-coated evaluation substrate with the multi-beams 20 each time while varying the deflection shift amount by the sub deflector 209 during tracking, under tracking deflection by the main deflector 208. The deflection shift amount should be a deflection amount corresponding to each shift position of deflection shift of multi-beams performed a plurality of times serially in one tracking operation (deflection shift cycle). The shot order, shift direction, and shift amount are determined depending on a writing sequence. Therefore, if the writing sequence is set in advance, the shot order, shift direction, and shift amount of a tracking operation (deflection shift cycle) can be determined. Regarding the measurement, a resist pattern is formed by developing the evaluation substrate written (exposed) by the multi-beams 20, and each patterned beam position should be measured. If it is difficult to individually determine the measurement of the pattern position after the exposure in the case of shifting per pixel 38, writing may be preferably performed for each shift position or for every several shift positions while changing the irradiation region of the evaluation substrate by moving the XY stage 105. Then, by calculating a difference from the design position, it is possible to obtain a positional deviation amount composed of a deviation amount of the irradiation position of each beam of the multi-beams 20 which depends on a beam shift amount (deflection amount of multi-beams 20) of deflection shift by the sub deflector 209, and a positional deviation from the design position of each beam caused by a tracking amount (second beam deflection amount) of tracking deflection by the main deflector 208. The obtained deviation amount data of the irradiation position of each beam is input into the writing apparatus 100, and obtained by the obtaining processing circuitry 53.

In the correction coefficient calculation step (S104), the correction coefficient calculation processing circuitry 54 calculates, for each beam and for each irradiation position, a correction coefficient of combined deflection deviation (that is, correction coefficient) for correcting a deviation amount of a beam irradiation position.

Figure 9A:
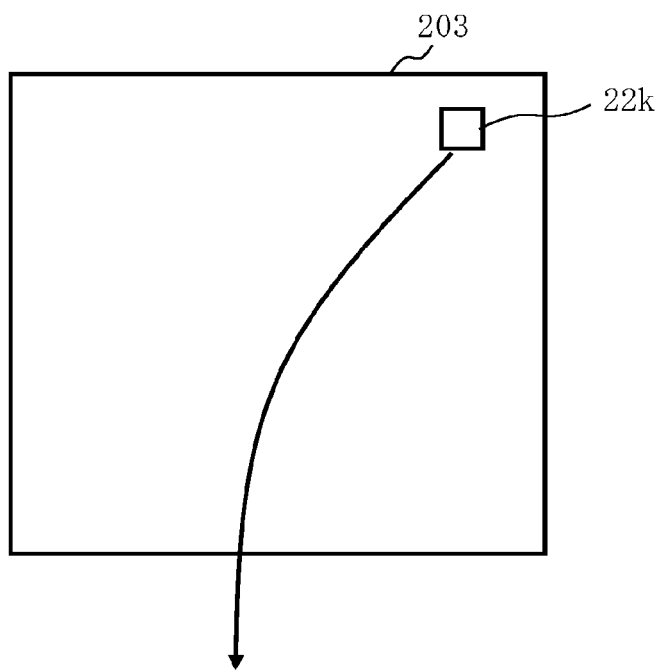
FIGS. 9A and 9B are schematic diagrams explaining a method for correcting a positional deviation of multi-beams depending on a tracking amount, according to the first embodiment.
Figure 9B:
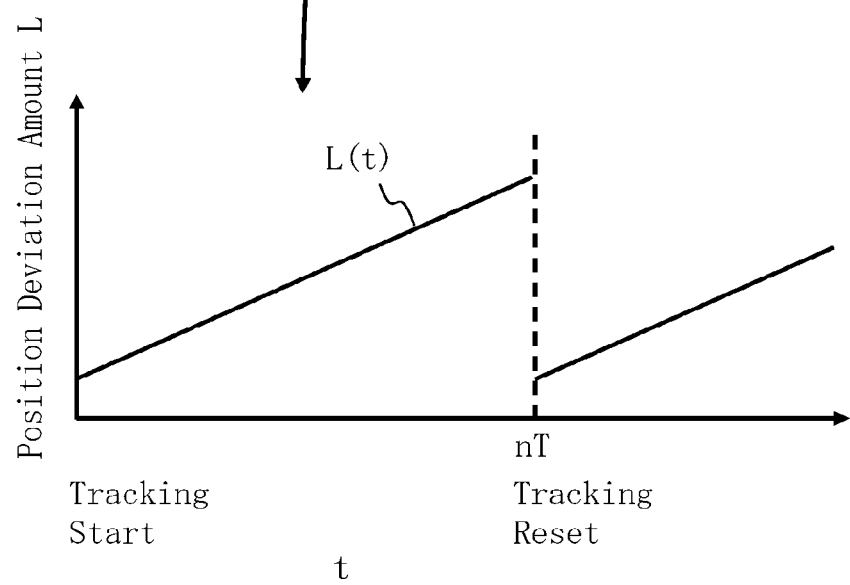

FIGS. 9A and 9B are schematic diagrams explaining a method for correcting a positional deviation of multi-beams depending on a tracking amount, according to the first embodiment. In the example of FIG. 9A, it will be described citing, for example, the hole 22k in the first column from the right and the first row from the top, in a plurality of holes 22 formed in the multi-beam forming plate 203. When emitting the beam 23k formed by having passed through the hole 22k to the desired target pixel 38(A") on the surface of the target object 101, as shown in FIG. 9B, the irradiation position of the beam 23k on the surface of the target object 101 deviates such that the deviation amount substantially increases in a first-order proportion to a tracking amount. In other words, positional deviation amounts of a plurality of tracking amounts can be approximated by a linear function. Then, first, the correction coefficient calculation processing circuitry 60 calculates, for each beam, a ratio (proportionality coefficient) of the deviation amount of an irradiation position to a tracking amount. In other words, the gradient of a linear function is calculated.

As has been described with reference to FIG. 7, a dose is divided (distributed) to surrounding pixels in order to correct a positional deviation. Therefore, first, according to a preset writing sequence, a plurality of irradiation positions to be irradiated with each beam during a tracking cycle are specified. Thereby, a tracking amount at each position is calculated, and a positional deviation amount is calculated with respect to each position. Even if each beam exposes a different grid 36, the positional relationship of each irradiation position (shot position) is the same. The positional deviation amount at each irradiation position can be approximated by multiplying a proportionality coefficient of a linear function by a tracking amount. The tracking amount can be obtained by multiplying a stage speed by a shot time (irradiation time). Therefore, the positional deviation amount at each irradiation position can be approximated by the product of a proportionality coefficient of a linear function, a stage speed, and a shot time (irradiation time).

As described above, when a beam position deviation occurs, such a deviation can be corrected by dividing (distributing) a dose to surrounding pixels, in proportion as an area ratio of a portion deviated from the target pixel in the direction opposite to the position deviation direction. Therefore, the correction coefficient calculation processing circuitry 54 specifies, for each beam and for each irradiation position (target pixel to be irradiated), surrounding pixels which are needed for correcting a deviation amount of a beam irradiation position, and calculates a ratio of a dose to be divided (distributed) to the specified surrounding pixels, and a ratio of the dose to be left for the target pixel, as correction coefficients of combined deflection deviation.

In the shot deviation amount measurement step (S102) described above, in the case where a deviation amount of the irradiation position of each beam, which depends on a beam shift amount of deflection shift, and a deviation amount of the irradiation position of each beam, which depends on a tracking amount, are separately measured, it is preferable to calculate each positional deviation amount for each beam and for each irradiation position, and after combining them, to divide (distribute) the dose to surrounding pixels, in proportion as an area ratio of a portion deviated from the target pixel in the direction opposite to the position deviation direction. In the case where a deviation amount of the irradiation position of each beam, which has originally been combined, is measured, it is preferable to calculate a positional deviation amount for each beam and for each irradiation position, and to divide (distribute) the dose to surrounding pixels, in proportion as an area ratio of a portion deviated from the target pixel in the direction opposite to the position deviation direction.

In the correction map generation step (S106) for each tracking cycle, the map generation processing circuitry 55 specifies, for each tracking cycle (deflection shift cycle) and for each beam, a pixel to be exposed, and generates a correction map in which a correction coefficient of combined deflection deviation of the specified pixel is defined.

Figure 10:
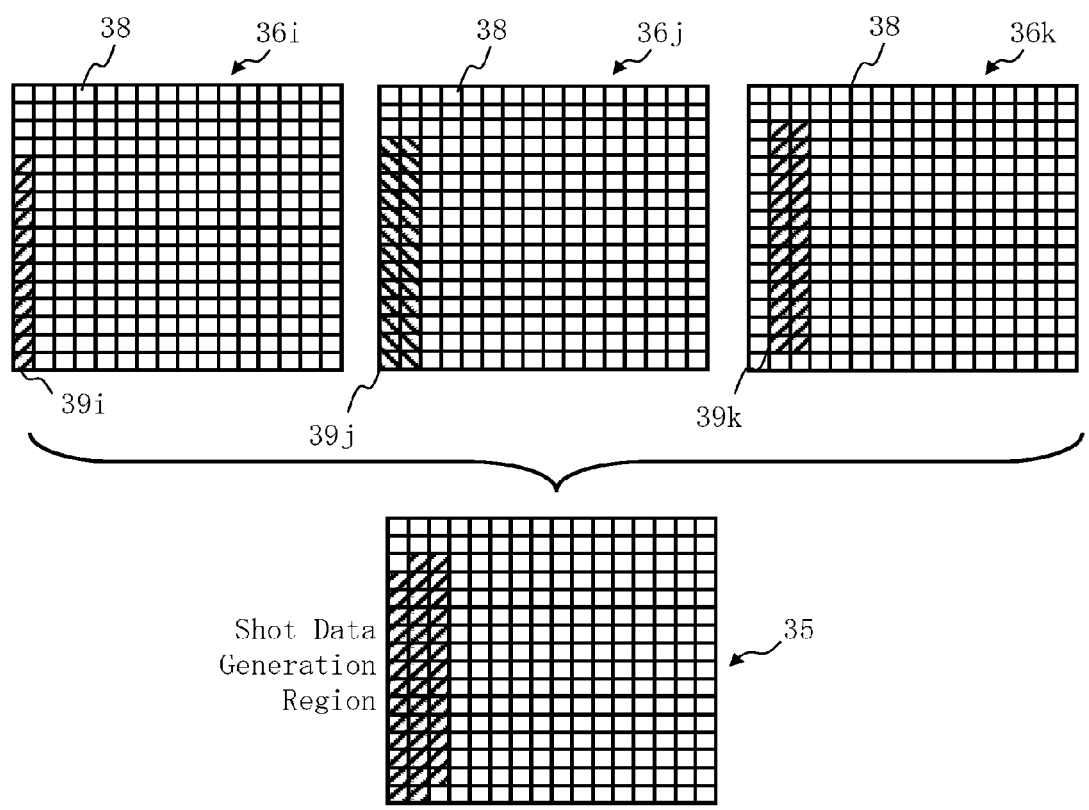
FIG. 10 shows another example of a correction map according to the first embodiment.

FIG. 10 shows another example of a correction map according to the first embodiment. FIG. 10 shows the case where the grid 36 is composed of 16×16 pixels. In FIG. 10, the correction map is mapped using the pixel 38 as a unit in the grid 36, and, for each tracking cycle (deflection shift cycle) and for each beam, a pixel 39 which needs to be exposed is shown in a plurality of pixels 38 in the grid 36 to be exposed by the beam concerned. A calculated correction coefficient of combined deflection deviation is defined as a map value for the pixel 39 which needs to be exposed. If a plurality of correction coefficients of combined deflection deviation are calculated for one pixel 38, a total value obtained by adding should be defined. Compared with the case (1), since more deflection deviation depending on tracking is included in the case (2), it turns out in the example of the correction map of FIG. 10 that the number of pixels 39 which need to be exposed increases more than that of the correction map of FIG. 8.

In the correction map combination step (S108) for each tracking cycle, the combining processing circuitry 56 combines, for each tracking cycle (deflection shift cycle), correction maps which have been generated for each tracking cycle (deflection shift cycle) and for each beam, in order to generate a combined map 35 as shown in FIG. 10. In the combined map 35, any pixel to be exposed by any one of beams is defined as the pixel 39 that needs to be exposed. Since the entire multi-beams 20 are collectively deflected, not being individually deflected, even if positions of the grids 36 to be irradiated by respective beams may be different from each other, irradiation (shot) is carried out at relatively the same position in all the grids 36 during tracking. The combined map 35 enables to specify, for each tracking cycle, the pixel 39 which needs to be exposed in a target tracking cycle concerned. That is, the number of the pixel 39 which needs to be exposed increases in proportion as the positional deviation amount due to a beam deflection increases. Since, in the case (2), a positional deviation from the design position of each beam caused by a beam shift amount (first beam deflection amount) of deflection shift by the sub deflector 209, and a positional deviation from the design position of each beam caused by a tracking amount (second beam deflection amount) of tracking deflection by the main deflector 208 are both corrected, the position deviation amount may increase. Therefore, the number of pixels required for correction may increase. As a result, the number of shot positions during a tracking cycle increases. Furthermore, it leads to increase of the exposure time (writing time).

In the shot data generation region setting step (S120) for each tracking cycle, the setting processing circuitry 57 specifies, referring to the combined map 35, the pixel 39 which needs to be exposed. Then, since shot data is needed for the pixel 39 to be exposed, the setting processing circuitry 57 sets a shot data generation region for each tracking cycle, based on the position of the pixel 39 which needs to be exposed.

In the shot data generation step (S122) for each tracking cycle, the writing data processing circuitry 50 generates shot data for a pixel in a shot data generation region. As described above, shot data is generated for each pixel 38, and the writing time (irradiation time) is calculated. The writing data processing circuitry 50 (shot data generation processing circuitry) generates, for each tracking operation, shot data in which a deviation amount of the irradiation position of each beam of multi-beams depending on a beam shift amount of deflection shift and a tracking amount is to be corrected, by using the correction coefficient of combined deflection deviation defined in the correction map for each beam. The dose of each pixel can be defined by a value obtained by multiplying a base dose, an area density of a pattern to be assigned to a pixel concerned, and a correction coefficient of combined deflection deviation of the pixel concerned. Therefore, the irradiation time can be obtained by dividing the dose of a pixel concerned by a current density J. The shot data is stored in the storage device 142.

In the determination step (S124), the determination processing circuitry 58 determines whether shot data for all the tracking cycles for writing the target stripe region 32 to be written has been generated. When the shot data for all the tracking cycles has not been generated yet, the shot data generation step (S122) and the determination step (S124) for each tracking cycle are repeated until the shot data for all the tracking cycles has been generated.

In the writing step (S126), the writing mechanism 150 writes, using the shot data, a pattern on the target object 101 with the multi-beams 20. Specifically, the deflection control circuit 130 (deflection control unit) outputs, based on the shot data, a blanking control signal to a control circuit for individual blanking formed on the blanking plate 204. After the blanking control signal is converted into an analog signal in the control circuit, a deflection voltage is applied to a blanker electrode corresponding to each of a plurality of blankers. Thereby, the deflection control circuit 130 controls a plurality of blankers, based on the shot data. Writing processing proceeds while performing a plurality of deflection shifts which are serially carried out in tracking according to the tracking operation described above.

As described above, both of a positional deviation from the design position of each beam, resulting from a beam shift amount (first beam deflection amount) of deflection shift by the sub deflector 209, and a positional deviation from the design position of each beam caused by a tracking amount (second beam deflection amount) of tracking deflection by the main deflector 208 can be reduced or eliminated.

As described above, according to the first embodiment, the positional deviation amount caused by beam deflection of each beam of multi-beams can be corrected individually.

Second Embodiment

In the case (2) according to the first embodiment, positional deviation depending on a tracking amount is corrected. As shown in FIG. 9B, the positional deviation amount increases in proportion as the tracking amount increases. Then, if the positional deviation amount increases, the number of pixels to which a dose is divided (distributed) when performing correction also increases in proportion to it. In the second embodiment, it will be described a configuration in which a writing sequence is corrected so that a positional deviation amount depending on a tracking amount may be small.

Figure 11:
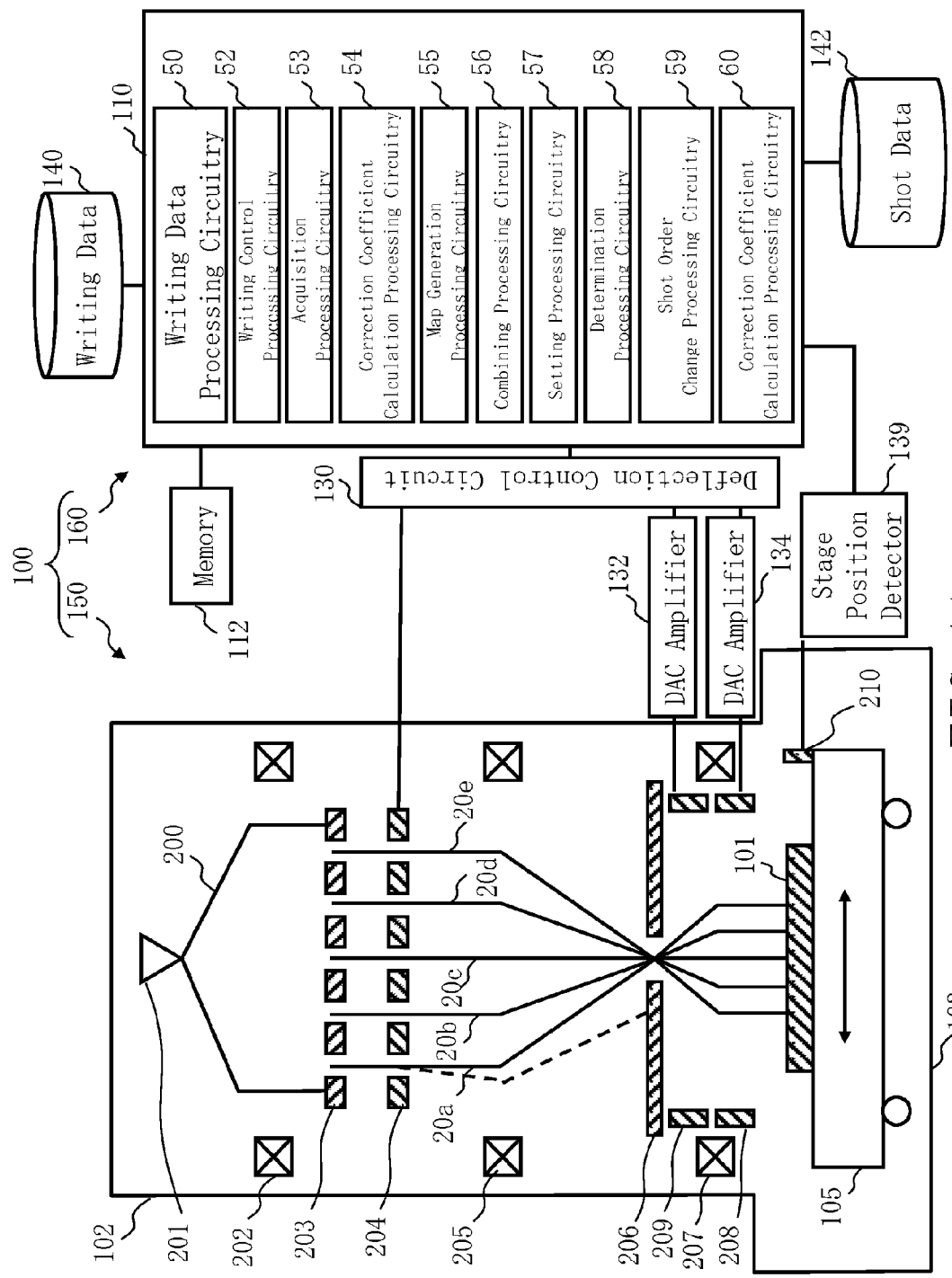
FIG. 11 is a schematic diagram showing a configuration of a writing apparatus according to a second embodiment.

FIG. 11 is a schematic diagram showing a configuration of a writing apparatus according to the second embodiment. FIG. 11 is the same as FIG. 1 except that a shot order change processing circuitry 59 is added in the control calculator 110. Each of the "processing circuities", such as the writing data processing circuitry 50, the writing control processing circuitry 52, the obtaining processing circuitry 53, the correction coefficient calculation processing circuitry 54, the map generation processing circuitry 55, the combining processing circuitry 56, the setting processing circuitry 57, the determination processing circuitry 58, the shot order change processing circuitry 59, and the correction coefficient calculation processing circuitry 60 includes an electric circuit, a quantum circuit, a computer, a processor, a circuit board, or a semiconductor device, for example. Each of the processing circuitries may use the common processing circuitry (same processing circuitry), or may use different processing circuitries (separated processing circuitries). Data which is input and output to/from the writing data processing circuitry 50, the writing control processing circuitry 52, the obtaining processing circuitry 53, the correction coefficient calculation processing circuitry 54, the map generation processing circuitry 55, the combining processing circuitry 56, the setting processing circuitry 57, the determination processing circuitry 58, and the correction coefficient calculation processing circuitry 60, and data being operated are stored in the memory 112 each time.

Figure 12:
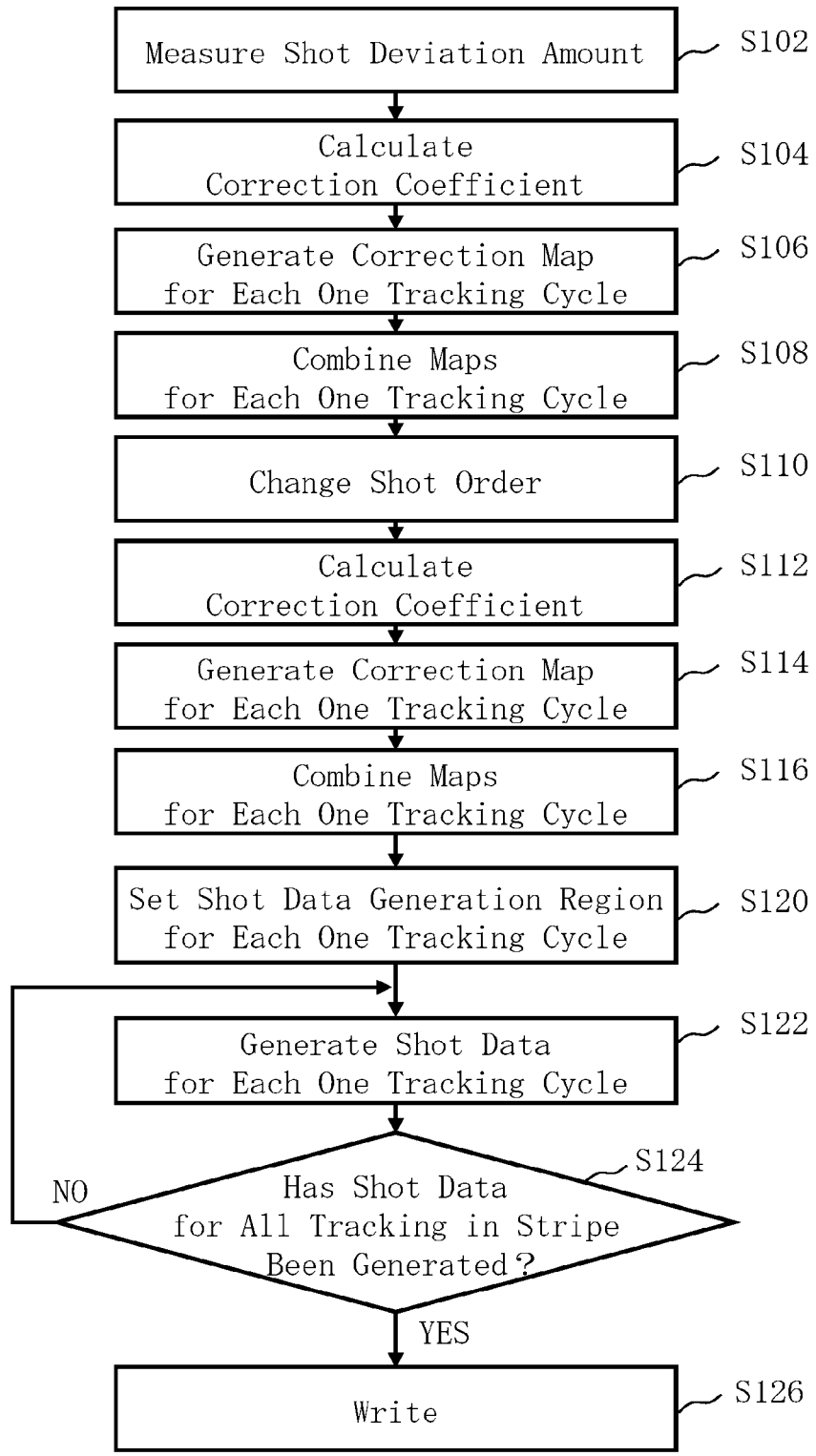
FIG. 12 is a flowchart showing main steps of a writing method according to the second embodiment.

FIG. 12 is a flowchart showing main steps of a writing method according to the second embodiment. FIG. 12 is the same as FIG. 6 except that a shot order change step (S110), a correction coefficient calculation step (S112), a correction map generation step (S114) for each tracking cycle, and a correction map combination step (S116) for each tracking cycle are added between the correction map combination step (S108) and the shot data generation region setting step (S120) for each tracking cycle. Moreover, the contents of the present embodiment are the same as those of the first embodiment except what is specifically described below. The contents of each step from the shot deviation amount measurement step (S102) to the correction map combination step (S108) for each tracking cycle are the same as those of the case (2) of the first embodiment. In other words, in the second embodiment, it is premised on correcting a positional deviation amount depending on a tracking amount.

Figure 13:
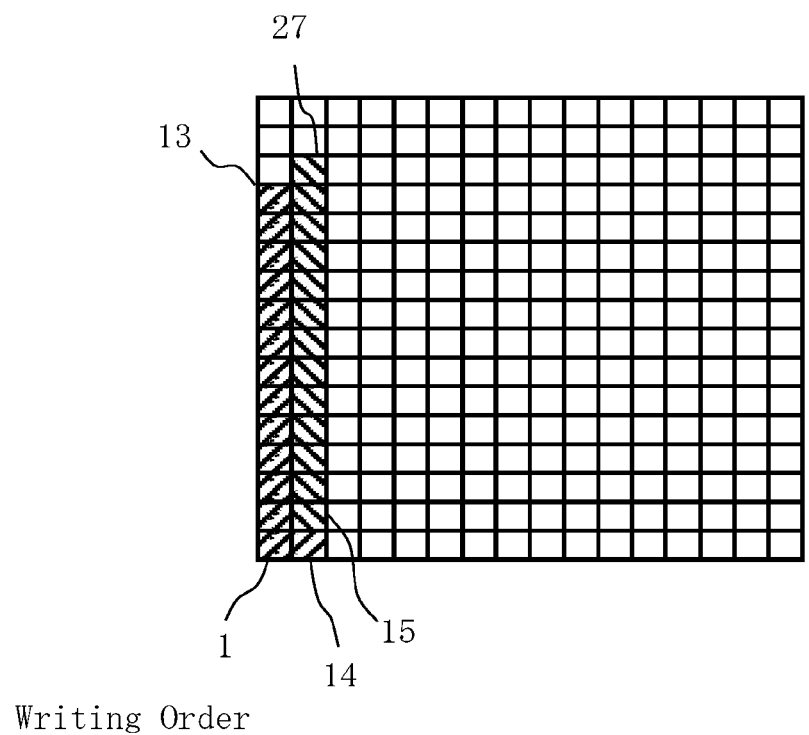
FIG. 13 shows an example of a shot order according to the second embodiment.

FIG. 13 shows an example of a shot order according to the second embodiment. The writing sequence should be set in advance, wherein, for example, the shot order (the order of writing) is set such that the shot starts upward from the left column and bottom row. In that case, with respect to the shot pixels in the example of the combined map 35 in the case (1) shown in FIG. 8, the shot is performed as shown in FIG. 13 as described below. For the first column from the left, thirteen shots are sequentially performed for the pixels from the first row from the bottom to the thirteenth row, and then, for the second column from the left, fourteen shots are sequentially performed for the pixels from the first row from the bottom to the fourteenth row. Therefore, twenty-seven shots are needed in one tracking cycle.

As described with reference to FIG. 9B, the positional deviation amount depending on the tracking amount increases in proportion as the tracking amount increases. When citing the beam 22$k$, if not considering a positional deviation amount depending on a tracking amount, it should have been sufficient that the pixels from the fifteenth to the twenty-seventh in the shot pixels shown in FIG. 13 were irradiated, and however, in the case of correcting a positional deviation amount depending on a tracking amount by the correction according to the shot order shown in FIG. 13, thirteen shots from the second row from the bottom to the fourteenth row need to be added in the third column from the left as shown in the combined map 35 of FIG. 10.

Figure 14:
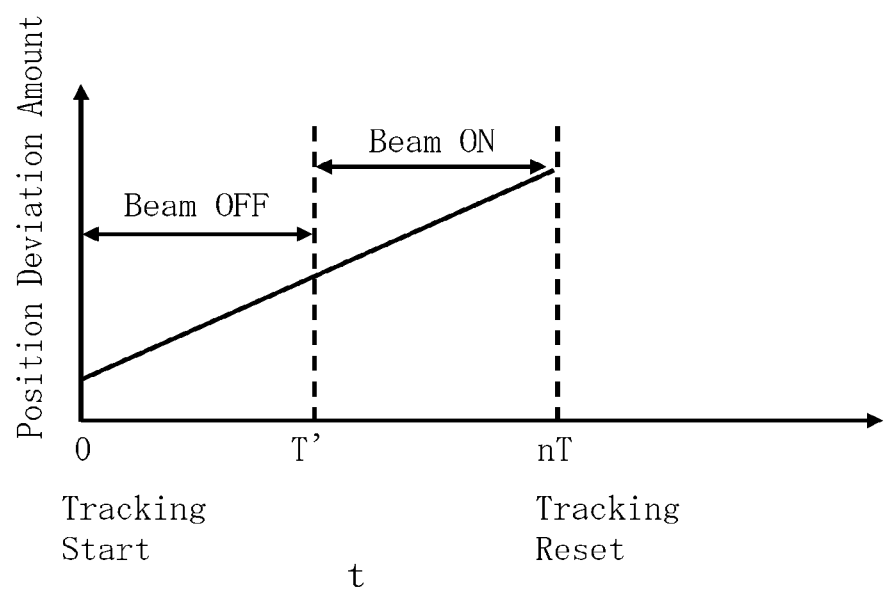
FIG. 14 shows a relation between a positional deviation amount and a tracking amount according to the second embodiment.

FIG. 14 shows a relation between a positional deviation amount and a tracking amount according to the second embodiment. During the time T' from the first shot to the fourteenth shot, the beam 22$k$ is in the state of OFF, and during the time (nT−T') from the fifteenth shot to the twenty-seventh shot, the beam 22$k$ is in the state of ON. As shown in FIG. 14, the positional deviation amount depending on the tracking amount during beam OFF is small, whereas the positional deviation amount depending on the tracking amount during beam ON is large. This indicates that the later the shot order to become beam ON is, the larger the positional deviation amount depending on the tracking amount is. Accordingly, as shown in FIG. 10, with respect to the beam 22$k$, thirteen shots for the pixels from the second row from the bottom in the third column from the left to the fourteenth row are needed. Therefore, according to the second embodiment, the positional deviation amount depending on the tracking amount is reduced by changing the shot order.

In the shot order change step (S110), the shot order change processing circuitry 59 changes the shot order from the preset one for the multi-beams so that the deviation amount of the irradiation position depending on the tracking amount may be small.

Figure 15:
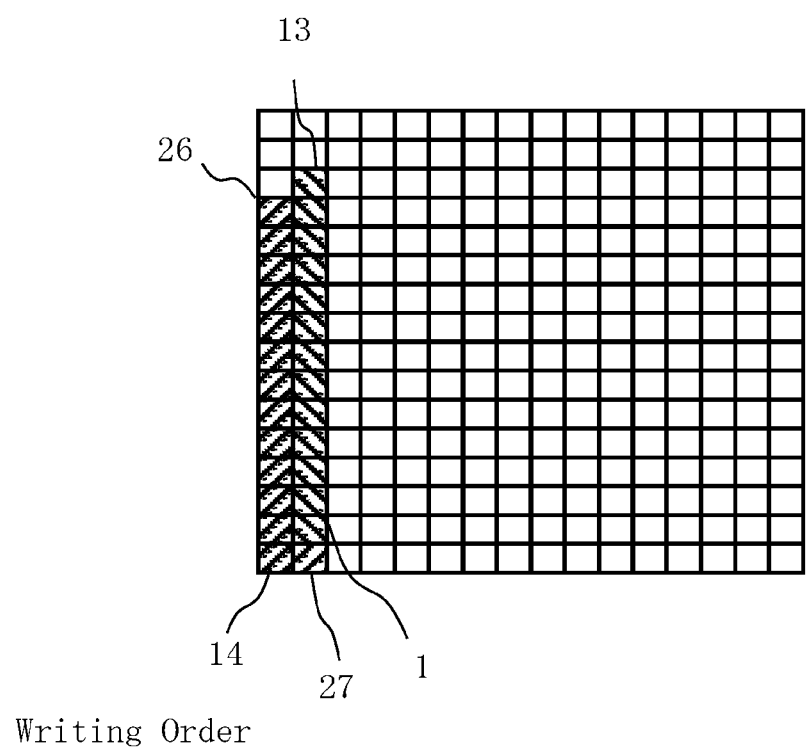
FIG. 15 shows an example of a changed shot order according to the second embodiment.

FIG. 15 shows an example of a changed shot order according to the second embodiment. In FIG. 15, with respect to shot pixels in the combined map 35 of the case (1) shown in FIG. 8, the shot order has been changed in order to be performed as described below. First, for the second column from the left, thirteen shots (from the first shot to the thirteenth shot) are sequentially performed for the pixels from the second row from the bottom to the fourteenth row, and then, for the first column from the left, thirteen shots (from the fourteenth shot to the twenty-sixth shot) are sequentially performed for the pixels from the first row from the bottom to the thirteenth row, and then further, the remaining pixel in the second column from the left and in the first row from the bottom is shot (the twenty-seventh shot). As a result, the beam 22$k$ is in the state of ON from the first shot to the thirteenth shot. Therefore, the positional deviation amount depending on the tracking amount during beam ON can be reduced. Consequently, the number of surrounding pixels which are needed for correcting the positional deviation amount depending on the tracking amount can be lessened.

In the correction coefficient calculation step (S112), the correction coefficient calculation processing circuitry 54 again calculates, for each beam and for each irradiation position, a correction coefficient of combined deflection deviation (that is, correction coefficient) for correcting a deviation amount of a beam irradiation position. Therefore, the correction coefficient calculation processing circuitry 54 again specifies, for each beam and for each irradiation position (target pixel to be irradiated), surrounding pixels which are needed for correcting a deviation amount of a beam irradiation position, and calculates a ratio of the dose to be divided (distributed) to the specified surrounding pixels, and a ratio of the dose to be left for the target pixel, as correction coefficients of combined deflection deviation in the case (2).

In the correction map generation step (S114) for each tracking cycle, the map generation processing circuitry 55 specifies, for each tracking cycle (deflection shift cycle) and for each beam, a pixel which needs to be exposed, and again generates a correction map in which the correction coefficient of combined deflection deviation for the specified pixel is defined.

In the correction map combination step (S116) for each tracking cycle, the combining processing circuitry 56 combines, for each tracking cycle (deflection shift cycle), correction maps which have been generated for each tracking cycle (deflection shift cycle) and for each beam, and again generates the combined map 35.

Figure 16A:
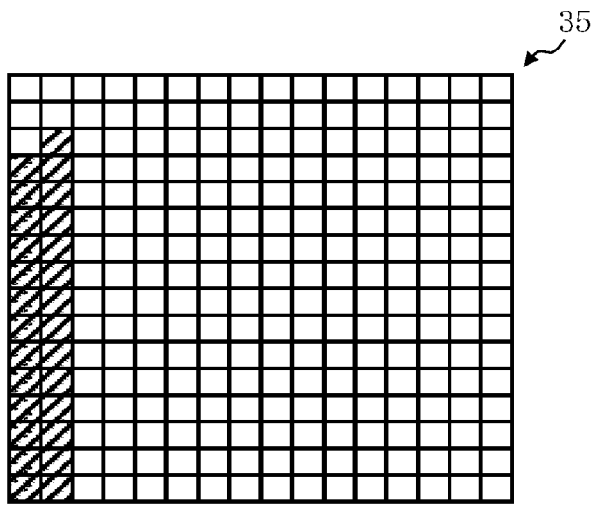
FIGS. 16A to 16C show an example of change of a combined map according to the second embodiment.
Figure 16B:
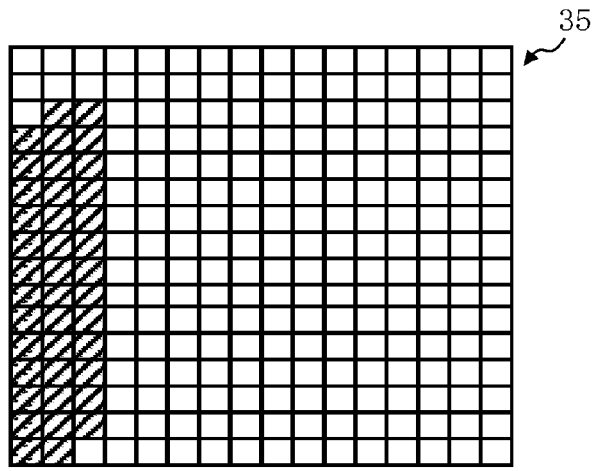
Figure 16C:
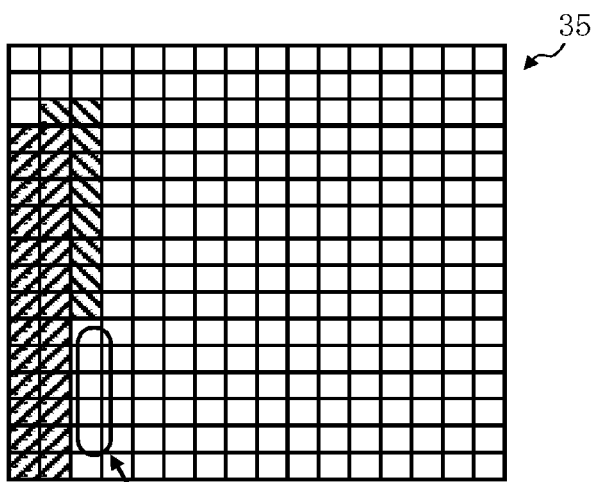

FIGS. 16A to 16C show an example of change of a combined map according to the second embodiment. FIG. 16A shows an example of pixels needed for correcting a positional deviation from the design position of each beam caused by a beam shift amount (first beam deflection amount) of deflection shift. FIG. 16B shows the state where the number of needed pixels has increased because the positional deviation from the design position of each beam resulting from a tracking amount (second beam deflection amount) has been corrected. In the example of FIG. 16B, in the third column from the left, thirteen shots for the pixels from the second from the bottom to the fourteenth row are added. However, by changing the shot order to the one shown in FIG. 15, it becomes possible to make it unnecessary to divide (distribute) the dose to surrounding pixels especially with respect to several shots whose shot orders are prior to others. Consequently, as shown in FIG. 16C, the number of pixels in need of receiving shots can be reduced. In the example of FIG. 16C, with respect to the third column from the left, five shots for the pixels from the second row from the bottom to the sixth row can be reduced, for example.

The contents of each step after the shot data generation region setting step (S120) for each tracking cycle are the same as those of the case (2) of the first embodiment.

As described above, by changing the shot order, the number of pixels which need to be irradiated during a tracking cycle can be reduced. Therefore, the writing time can be shortened.

Embodiments have been explained referring to concrete examples described above. However, the present invention is not limited to these specific examples. For example, although in the second embodiment each of the correction coefficient calculation step (S104), the correction map generation step (S106) for each tracking cycle, and the correction map combination step (S108) for each tracking cycle is performed according to a pre-set shot order before changing the shot order, it is not limited thereto. It is also preferable to perform the shot order change step (S110) after the shot deviation amount measurement step (S102), omitting the correction coefficient calculation step (S104), the correction map generation step (S106) for each tracking cycle, and the correction map combination step (S108) for each tracking cycle.

While the apparatus configuration, control method, and the like not directly necessary for explaining the present invention are not described, some or all of them can be selectively used on a case-by-case basis. For example, although description of the configuration of the control unit for controlling the writing apparatus 100 is omitted, it should be understood that some or all of the configuration of the control unit can be selected and used appropriately when necessary.

In addition, any other multi charged particle beam writing method and multi charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
   a stage configured to mount a target object thereon and to be continuously movable;
   an emitter configured to emit a charged particle beam;
   a multi-beam forming plate, in which a plurality of openings are formed, configured to form multi-beams by letting a region including a whole of the plurality of openings be irradiated with the charged particle beam and letting portions of the charged particle beam individually pass through a corresponding opening of the plurality of openings;
   a blanking array plate in which there are arranged a plurality of blankers configured to individually perform blanking deflection for a corresponding beam of the multi-beams having passed through the plurality of openings of the multi-beam forming member;
   a limiting aperture plate configured to block each beam having been deflected to be in an "off" state by at least one of the plurality of blankers;
   a deflector configured to perform collective deflection of each beam in an "on" state having passed through the limiting aperture member;
   an obtaining processing circuitry configured to obtain a deviation amount of an irradiation position of each beam of the multi-beams depending on a deflection amount of the multi-beams;
   a correction coefficient calculation processing circuitry configured to calculate a correction coefficient for correcting the deviation amount of the irradiation position, for each beam and for each irradiation position;
   a shot data generation processing circuitry configured to generate shot data in which the irradiation position of the each beam of the multi-beams is corrected by using the correction coefficient, for each deflection shift cycle in a case where writing processing is performed while repeating a deflection shift cycle with treating continuous deflection shifts of the multi-beams performed a plurality of times as one deflection shift cycle; and
   a deflection control processing circuitry configured to control the plurality of blankers, based on the shot data.

2. The apparatus according to claim 1, wherein the correction coefficient calculation processing circuitry specifies, for each beam and for each irradiation position, surrounding irradiation positions which are needed for correcting a deviation amount of a beam irradiation position, and calculates a ratio of a dose to be distributed to specified surrounding irradiation positions, as the correction coefficient, and a ratio of a dose to be left for a target pixel, as the correction coefficient.

3. The apparatus according to claim 1, wherein the one deflection shift cycle indicates to repeat the collective deflection a predetermined number of times while shifting the irradiation position, further comprising:
 a map generation processing circuitry configured to specify an irradiation position which needs to be exposed, for each beam and for each the deflection shift cycle, and generate a correction map in which the correction coefficient of the irradiation position having been specified is defined.

4. The apparatus according to claim 3, wherein, in a case where a plurality of correction coefficients, each being the correction coefficient, are calculated for one specified irradiation position, a total value obtained by adding the plurality of correction coefficients is defined, as a map value of the one specified irradiation position, in the correction map.

* * * * *